United States Patent
Yang et al.

(10) Patent No.: US 12,495,537 B2
(45) Date of Patent: Dec. 9, 2025

(54) METHOD FOR MANUFACTURING SEMICONDUCTOR STRUCTURE, SEMICONDUCTOR STRUCTURE AND SEMICONDUCTOR MEMORY

(71) Applicant: CHANGXIN MEMORY TECHNOLOGIES, INC., Hefei (CN)

(72) Inventors: Mengmeng Yang, Hefei (CN); Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 661 days.

(21) Appl. No.: 17/939,017

(22) Filed: Sep. 7, 2022

(65) Prior Publication Data

US 2023/0011180 A1    Jan. 12, 2023

(30) Foreign Application Priority Data

Jun. 10, 2022 (CN) .......................... 202210656682.6

(51) Int. Cl.
H10B 12/00    (2023.01)

(52) U.S. Cl.
CPC ............. *H10B 12/30* (2023.02); *H10B 12/03* (2023.02); *H10B 12/05* (2023.02); *H10B 12/482* (2023.02); *H10B 12/488* (2023.02)

(58) Field of Classification Search
CPC ........ H10B 12/03; H10B 12/05; H10B 12/30; H10B 12/482; H10B 12/488
See application file for complete search history.

(56) References Cited

U.S. PATENT DOCUMENTS

| | | | | |
|---|---|---|---|---|
| 2012/0119286 A1* | 5/2012 | Kim | ..................... | H10D 62/378 257/329 |
| 2012/0181606 A1* | 7/2012 | Nagai | ..................... | H10B 12/01 257/334 |

FOREIGN PATENT DOCUMENTS

| | | | | |
|---|---|---|---|---|
| CN | 112635463 A | 4/2021 | | |
| CN | 112736081 A | 4/2021 | | |
| WO | WO-2009096469 A1 * | 8/2009 | ......... | G11C 11/4023 |
| WO | WO-2019099392 A1 * | 5/2019 | ........... | B81B 3/0021 |

* cited by examiner

*Primary Examiner* — Brook Kebede
(74) *Attorney, Agent, or Firm* — Syncoda LLC; Feng Ma

(57) ABSTRACT

Provide is a method for manufacturing a semiconductor structure, a semiconductor structure, and a semiconductor memory. The method includes the following operations. A substrate is provided. Multiple silicon pillars are formed in the substrate, and extend along a first direction. In the first direction, each of the silicon pillars includes a first portion and a second portion. An insulating layer is formed in the second portion of the silicon pillar. A conductive layer is formed in the first portion of the silicon pillar. A capacitor layer is formed on surfaces of the insulating layer and the conductive layer of the silicon pillar.

18 Claims, 33 Drawing Sheets

METHOD FOR MANUFACTURING SEMICONDUCTOR STRUCTURE, SEMICONDUCTOR STRUCTURE AND SEMICONDUCTOR MEMORY

CROSS-REFERENCE TO RELATED APPLICATION

This application claims priority to Chinese Patent Application No. 202210656682.6, filed on Jun. 10, 2022, and entitled "Method for Manufacturing Semiconductor Structure, Semiconductor Structure and Semiconductor Memory", the disclosure of which is hereby incorporated by reference in its entirety.

BACKGROUND

With the development of semiconductor technology, gate all around (GAA), as the next generation technology of fin field-effect transistor (FinFet), can further save space. On this basis, by using three dimensional (3D) structure, the structure of semiconductor memory is expanded upward again, which is of great help to the development of dynamic random access memory (DRAM) and other memories. Among others, a capacitor is the part of a semiconductor memory for storing data, and the data value of a memory cell is judged by the charge carried by the capacitor. The leakage of the capacitor will affect the performance of the semiconductor memory.

SUMMARY

The disclosure relates to the technical field of semiconductors, in particular to a method for manufacturing a semiconductor structure, a semiconductor structure, and a semiconductor memory.

The disclosure provides a method for manufacturing a semiconductor structure, a semiconductor structure and a semiconductor memory.

In the first aspect, embodiments of the disclosure provide a method for manufacturing a semiconductor structure, which includes the following operations.

A substrate is provided. A plurality of silicon pillars are provided in the substrate, and the plurality of silicon pillars all extend along a first direction. Each of the silicon pillars includes a first portion and a second portion along the first direction.

An insulating layer is formed at the second portion of the silicon pillar.

A conductive layer is formed at the first portion of the silicon pillar.

A capacitor layer is formed on surfaces of the insulating layer and the conductive layer of the silicon pillar.

In the second aspect, the embodiments of the disclosure provide a semiconductor structure including a substrate, in which a plurality of silicon pillars are formed in the substrate and extend along a first direction, each silicon pillar includes a first portion and a second portion in the first direction; an insulating layer formed at the second portion of the silicon pillar: a conductive layer formed at the first portion of the silicon pillar; and a capacitor layer formed on surfaces of the insulating layer and the conductive layer of the silicon pillar.

In the third aspect, the embodiments of the present disclosure provide a semiconductor memory, which includes a semiconductor structure as described in any one of the second aspect.

DETAILED DESCRIPTION

Figure 1:
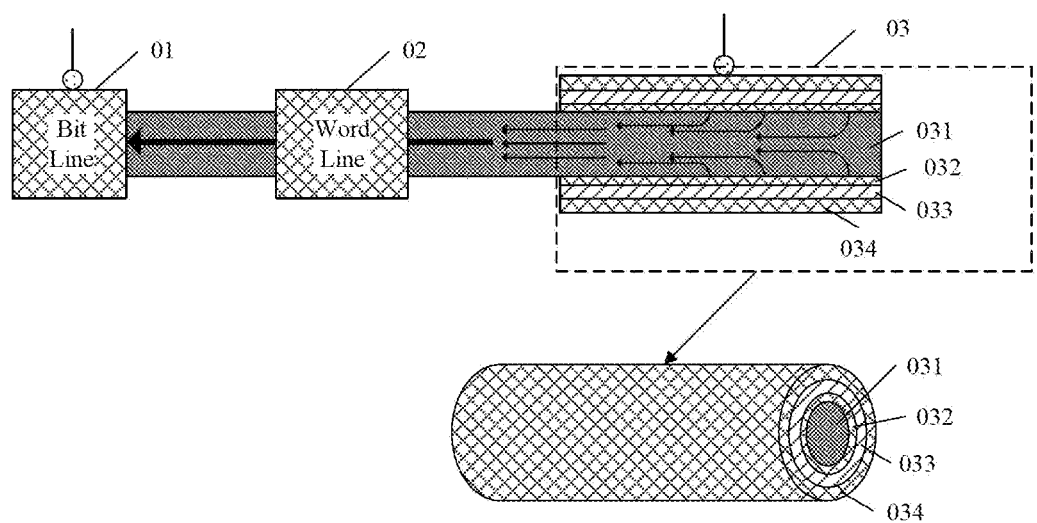
FIG. 1 is a structural scheme diagram of a semiconductor structure.

The technical solution of the embodiments of the disclosure will be clearly and fully described below in combination with the accompanying drawings in the embodiments of the disclosure. It should be understood that the specific embodiments described herein are for the purpose of explaining the disclosure only, but not limiting the disclosure. In addition, it is to be noted that, for convenience of description, only the part related to the disclosure are shown in the drawings.

Unless otherwise defined, all technical and scientific terms used herein have the same meanings as those commonly understood by those skilled in the art of the disclosure. The terms used herein are for the purpose of describing specific embodiments only, and are not intended to limit the disclosure.

In the following description, the description with respect to "some embodiments" describes a subset of all possible embodiments. However, it should be understood that "some embodiments" may be the same subset or different subsets of all the possible embodiments, and may be combined with each other as long as there is no conflict.

It should be pointed out that, the terms "first\second\third" involved in the embodiments of the disclosure are only to distinguish similar objects, but do not represent a specific ordering of the objects. It should be understood that the order of "first\second\third" where it is allowable, may be interchanged or reversed, to enable the embodiments of the disclosure described herein to be implemented in an order other than those illustrated or described herein.

The history of development of the semiconductor technology is essentially the history of reduction of transistor's size. From the 10-micron node in 1970s, following Moore's Law, transistor's size reaches today's 5-nanometer node step by step. In this process, whenever difficulties were encountered, new technologies always emerged in time and led the semiconductor technology continuously moving forward following Moore's Law. Specifically, GAA, as the next generation technology of FinFet, can further save space. At the same time, on this basis, the structure is spatially expanded upward again by using 3D structural mode, which is of great help to the development of DRAM. However, the structural design of 3D DRAM has not been finalized. Therefore, how to design 3D DRAM more ingeniously is very important.

Referring to FIG. 1, it shows a structural scheme diagram of a semiconductor structure. As shown in FIG. 1, the semiconductor structure includes a bit line 01, a word line 02, a capacitor 03 and a transistor (not marked in the figure), the gate of the transistor is connected to the word line 02, and the source and drain of the transistor are connected to the capacitor 03 and the bit line 02, respectively. The capacitor 03 includes a silicon pillar 031, and a capacitor layer consisting of a lower electrode plate 032, a dielectric layer 033, and an upper electrode plate 034. The lower electrode plate 032 is formed on a surface of the silicon pillar 031. The silicon pillar 031 is directly connected to the lower electrode plate 032. The dielectric layer 033 is formed on a surface of the lower electrode plate 032, and the upper electrode plate 034 is formed on a surface of the dielectric layer 033. In this case, even when no voltage is applied to the word line 02, electric leakage of the capacitor 03 continuously occurs. As shown in FIG. 1, the leakage continuously occurs from the lower electrode plate 032 and through the silicon pillar 031 (as indicated by arrows in the silicon pillar), resulting in a leakage current, which affects the performance of the semiconductor structure.

Based on this, the embodiments of the present disclosure provide a method for manufacturing a semiconductor structure. The basic idea of the method includes the following operations. A substrate is provided. Multiple silicon pillars are formed in the substrate, and extend along a first direction. In the first direction, each of the silicon pillars includes a first portion and a second portion. An insulating layer is formed at the second portion of the silicon pillar. A conductive layer is formed at the first portion of the silicon pillar. A capacitor layer is formed on surfaces of the insulating layer and the conductive layer of the silicon pillar. By doing so, in each of the capacitor structures, the second portion of the silicon pillar is oxidized to form the insulating layer, and only the first portion of the silicon pillar is retained to form the conductive layer. Therefore, a conductive area between the capacitor layer and the silicon pillar is reduced, so that current can only flow through part of the silicon pillar via the conductive layer, thus reducing the leakage of the capacitor and improving the performance of the semiconductor structure.

Embodiments of the disclosure will be described in detail below with reference to the accompanying drawings.

Figure 2:
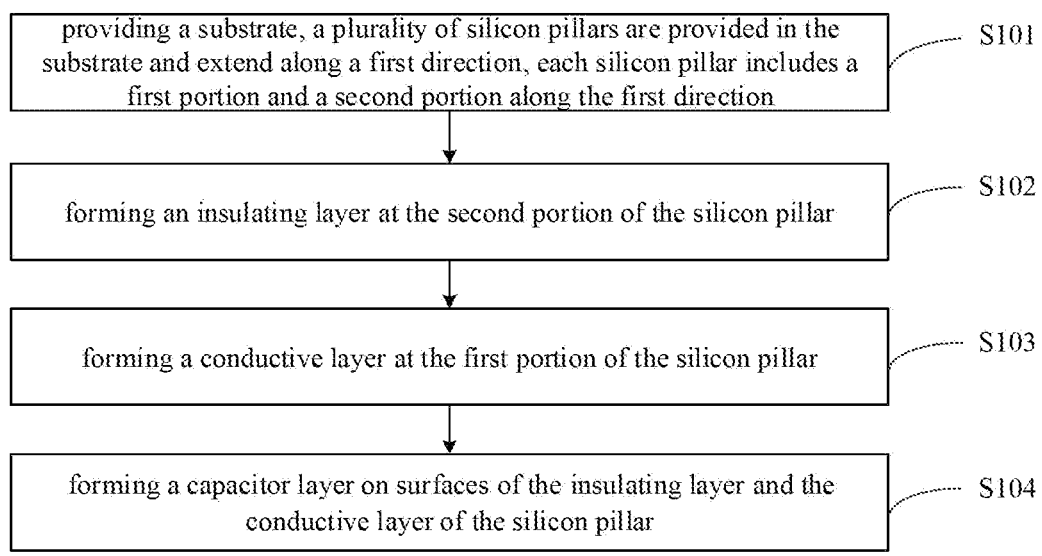
FIG. 2 is a flowchart of a method for manufacturing a semiconductor structure provided by an embodiment of the disclosure.

In an embodiment of the disclosure, referring to FIG. 2, it is a flowchart of a manufacturing method of a semiconductor structure provided by an embodiment of the disclosure. As shown in FIG. 2, the method may include the following operations.

In S101, a substrate is provided. Multiple silicon pillars are formed in the substrate, and the multiple silicon pillars extend along a first direction. Each of the silicon pillars includes a first portion and a second portion in the first direction.

It is to be noted that, the manufacturing method provided by the embodiments of the disclosure is applied to manufacturing semiconductor structures, and specifically is a manufacturing method for reducing leakage of 3D DRAM with lateral capacitors. That is, the semiconductor structure may be a 3D semiconductor structure, which is mainly used in semiconductor memories such as DRAM. When manufacturing the semiconductor structure, firstly, a substrate is provided, and multiple silicon pillars are formed in the substrate.

Figure 3:
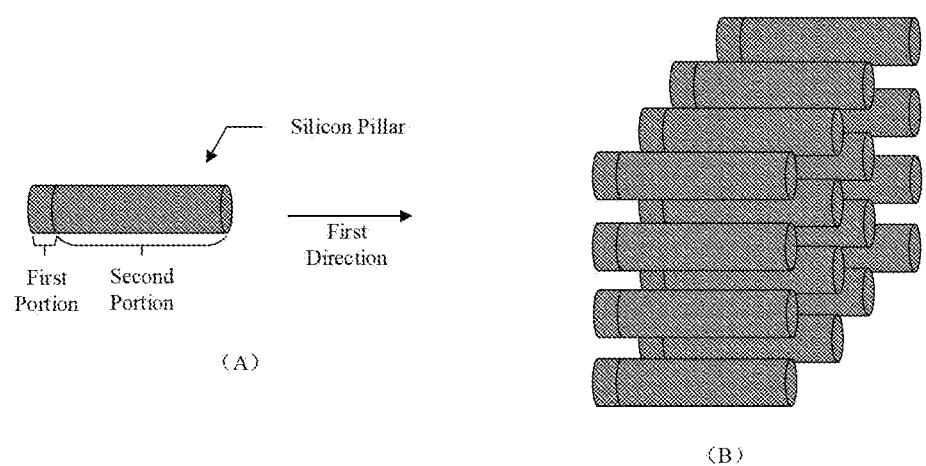
FIG. 3 is structural scheme diagrams of silicon pillars provided by an embodiment of the disclosure.

Referring to FIG. 3, it shows structural scheme diagrams of silicon pillars provided by an embodiment of the present disclosure. In FIG. 3, (A) shows one silicon pillar. As shown in (A), the silicon pillar extends along a first direction, and the silicon pillar is divided into a first portion and a second portion along the first direction. The first direction may represent a horizontal direction, that is, multiple silicon pillars are all lateral silicon pillars for forming multiple lateral capacitors. In the substrate, the multiple silicon pillar can be arranged as a spatial array, which may be shown in (B) of FIG. 3. Based on the multiple silicon pillar arranged in the spatial array, an integration level of the semiconductor structure can be improved and the storage performance can be improved.

For the formation of the substrate, in some embodiments, providing the substrate may include the following operations.

An initial substrate is provided.

A stack structure is formed above the initial substrate.

The multiple silicon pillars are formed in the stack structure. Spacer structures are provided between the first portions of the multiple silicon pillars.

It is to be noted that, when forming the substrate, firstly, the initial substrate is provided, then the stack structure is formed above the initial substrate, and further the multiple silicon pillars is formed in the stack structure. The spacer structures are formed between the first portions of the multiple silicon pillars. That is, during or after forming the multiple silicon pillars, the spacer structures are formed to wrap the first parts of the multiple silicon pillars.

Further, in the semiconductor structure, in addition to the capacitors formed in the region where the silicon pillars are formed, other structures such as transistors, word lines and bit lines are also formed therein. In some embodiments, the initial substrate may include a bit line region, a transistor region, a capacitor region and a word line region.

The formation of the multiple silicon pillars in the stack structure may include the following operation.

The multiple silicon pillars are formed in the stack structure above the capacitor region.

When forming the multiple silicon pillars in the stack structure, the method may include the following operations.

Multiple transistors are formed in the stack structure above the transistor region.

Multiple word line structures are formed in the stack structure above the word line region.

Multiple bit line structures are in the stack structure above the bit line region.

In the first direction, the multiple bit lines, the multiple transistors and the multiple silicon pillars are arranged sequentially, and in a second direction, the multiple transistors and the multiple word lines are arranged sequentially.

Figure 4:
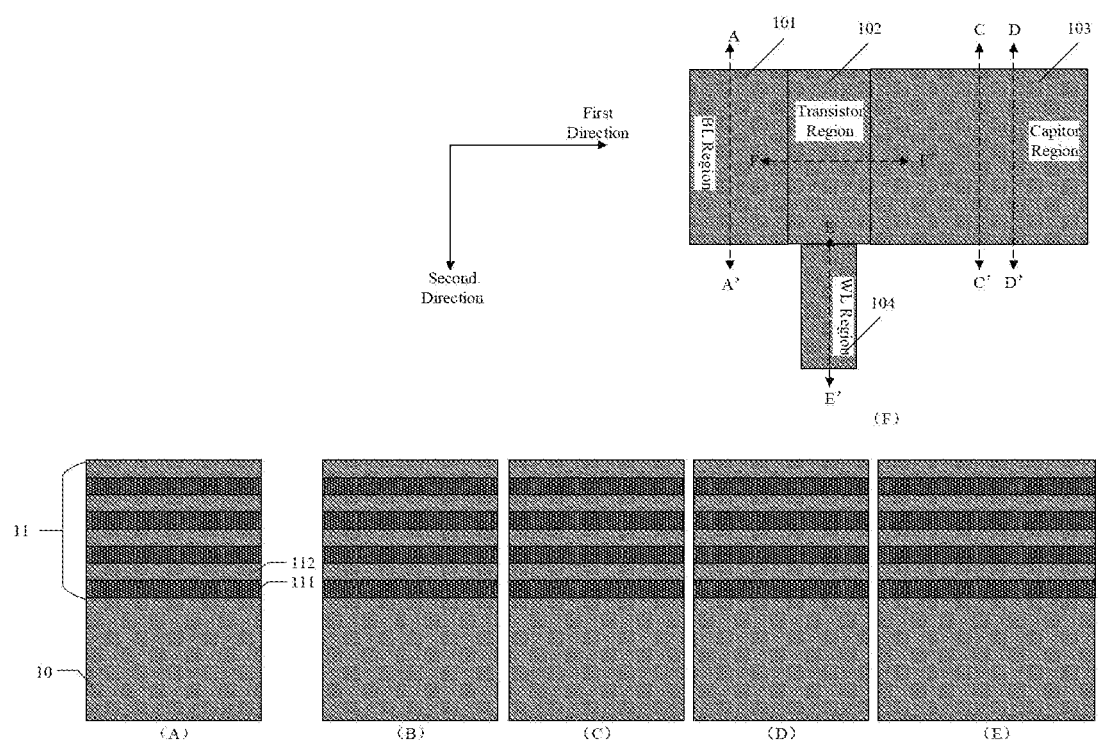
FIGS. 4 to 29 are scheme diagrams showing semiconductor structures obtained in a process of a method for manufacturing a semiconductor structure provided by an embodiment of the disclosure.

It is to be noted that, FIG. 4 is a scheme diagram of a structure obtained after forming the stack structure, where (F) is a schematic top view of the initial substrate 10. (A) is a cross-sectional diagram along the AA' direction, (B) is a cross-sectional diagram along the FF' direction, (C) is a cross-sectional diagram along the CC' direction, (D) is a cross-sectional diagram along the DD' direction, and (E) is a cross-sectional diagram along the EE' direction. In addition, in FIGS. 5 to 30, (A), (B), (C), (D) and (E) respectively show the cross sections along the same directions as those in FIG. 4, which will not be repeatedly described hereinafter.

In FIG. 4, as shown in (F), the initial substrate 10 may be divided into a bit line region 101, a transistor region 102, a capacitor region 103 and a word line region 104. Along the first direction, the bit line region 101, the transistor region 102 and the capacitor region 103 are arranged in sequence. Along the second direction, the transistor region 102 and the word line region 104 are arranged in sequence. The bit line region 101 is for forming the multiple bit lines above the bit line region 101 in subsequent operations. The transistor region 102 is for forming multiple transistors above the transistor region 102 in subsequent operations. The capacitor region 103 is for forming the multiple capacitors above the capacitor region 103 in subsequent operations. The word line region 104 is for forming the multiple word lines above the word line region 104 in subsequent operations. Accordingly, in the resulting semiconductor structure, in the first direction, the multiple bit lines, the multiple transistors and the multiple silicon pillars are arranged sequentially, and in the second direction, the multiple transistors and the multiple word lines are arranged sequentially.

It is also to be noted that, the initial substrate 10 may be silicon substrate or other suitable substrate materials such as compounds of silicon, germanium or silicon-germanium, etc., for example, doped or undoped monocrystalline silicon substrate, polysilicon substrate, etc., which are not specifically limited by the embodiments of this disclosure.

As shown in FIG. 4 after the initial substrate 10 is provided, the initial substrate 10 may first be pre-cleaned and then the initial stack structure 11 is formed over the substrate 10.

In some embodiments, the stack structure 11 includes at least one stack layer, and the stack layer may include a sacrificial layer and a silicon layer.

The formation of a stack structure above the initial substrate may include the following operations.

A sacrificial layer 111 is formed on the initial substrate 10 and a silicon layer 112 is formed on the sacrificial layer 111.

The formation of a sacrificial layer 111 and a silicon layer 112 is repeated until the stack structure 11 is formed.

It is to be noted that, as shown in FIG. 4, the stack structure 11 may be composed of the sacrificial layers 111 and the silicon layers 112 alternately arranged. A group of adjacent one sacrificial layer 111 and one silicon layer 112 is referred to as a stack layer, in which the silicon layer 112 is formed on the sacrificial layer 111. The operation of forming a sacrificial layer 111 and a silicon layer 112 over the initial substrate 10 is repeated until a desired number of the stacked layers are obtained. For example, in FIG. 4, the number of the stack layers is four. In practical application, the number of the stack layers may be any desired number which is not specifically limited by the embodiments of the disclosure.

It is to be noted that, a material of the sacrificial layers 111 can be silicon germanium (SiGe), and a method for forming the sacrificial layers 111 may be epitaxial growth. A material of the silicon layers 112 may be silicon (Si), and a method for forming the silicon layers 112 may also be epitaxial growth. When the silicon layers 112 is formed, the silicon layers 112 may be doped, and a doping mode can be N doping or N+ doping.

After the stack structure 11 is formed, the stack structure 11 is subjected to a process such as patterning, and the multiple silicon pillars, the multiple transistors, the multiple word lines and the multiple bit lines are formed in the stack structure 11. The multiple silicon pillars are formed in the stack structure 11 above the capacitor region 103. The multiple transistors are formed in the stack structure 11 above the transistor region 102. The multiple word lines are formed in the stack structure 11 above the word line region 104. The multiple bit lines are formed in the stack structure 11 above the bit line region 101.

For the formation of the multiple silicon pillars, in some embodiments, forming the multiple silicon pillars in the stack structure above the capacitor region may include the following operations.

A first patterning processing is performed on the stack structure to form multiple first trenches in the stack structure.

The multiple silicon pillars are formed in the stack structure above the capacitor region by retaining silicon layers between the first trenches.

The first trenches extend along the first direction.

Figure 5:
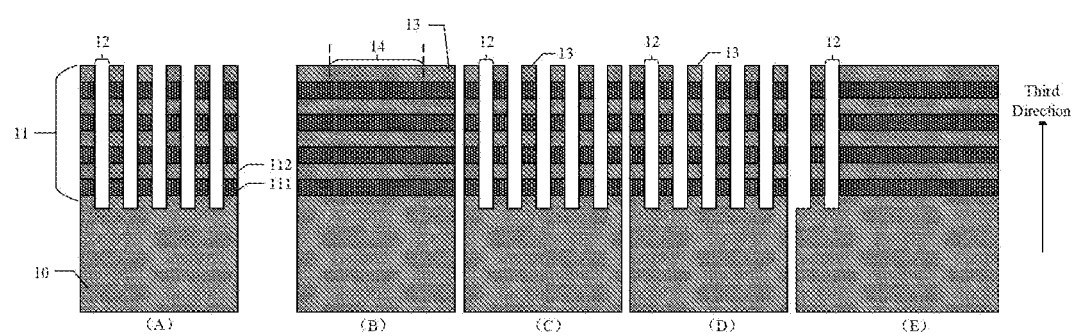

It is to be noted that, FIG. 5 shows a scheme diagram of a structure obtained after forming the multiple silicon pillars 13. The method for performing the first patterning processing on the stacked structure 11 may be as follows. Firstly, a first mask layer is formed on the stacked structure 11, and then a first photoresist layer is formed on the first mask layer. The first photoresist layer has a first pattern for forming the first trenches 12, and the first pattern extends in the first direction. The first pattern is transferred to the first mask layer, and the first photoresist layer is removed. The first mask layer is used as a mask to continue transferring the first pattern to the stacked structure 11, and the first mask layer is removed to form the multiple first trenches 12. In addition, as shown in FIG. 5, the first trenches 12 may also be partially formed in the substrate 10. The first mask layer may be a single-layer mask layer or a composite mask layer. For example, the first mask layer may be a composite mask layer composed of a layer of silicon oxide and a layer of silicon nitride. The first mask layer may be formed by deposition. A method of the first patterning processing may be a self-aligned double patterning (SADP). Thus, the first pattern extends in the first direction is formed in the first mask layer. The first photoresist layer and the first mask layer may be removed by etching.

The method for transferring the pattern to the stack structure 11 may be etching. In FIG. 5, the portion of the stack structure 11 located directly below the first pattern is completely etched, and the portion of the initial substrate 10 located directly below the first pattern is partially etched, so as to form the multiple first trenches 12 having a high aspect ratio (HAR), and the first trenches 12 extend in the first direction.

As shown in FIG. 5, after performing the first patterning processing, the multiple first trenches 12 are formed in the stack structure 11. The multiple first trenches 12 are formed above the bit line region 101, the transistor region 102 and the capacitor region 103. The first trenches 12 are formed in only a partial region above the word line region 104 for subsequent formation of the word lines in staircase.

The first trenches 12 divide the sacrificial layers 111 and the silicon layers 112 in the stack structure 11 along the second direction. In the embodiments of the disclosure, the first direction, the second direction and the third direction may be perpendicular to each other. The three directions constitute a spatial rectangular coordinate system in which the first direction is a horizontal X direction, the second direction is a horizontal Y direction, and the third direction is a vertical Z direction.

In the stack structure 11 located above the capacitor region 103, the silicon layers 112 divided by the first trenches 12 form the multiple silicon pillars 13. The multiple silicon pillars 13 are formed in the stack structure 11 above the capacitor region 103 by retaining the silicon layers 112 between the first trenches 12.

It is also to be noted that while forming the multiple silicon pillars 13, in the stack structure 11 located above the transistor region 103, the silicon layers 112 divided by the first trenches 12 form the multiple active pillars 14 simultaneously. In the stack structure 11 above the transistor region 102, the multiple active pillars 14 are formed by retaining the silicon layers 112 between the first trenches 12, to form the multiple transistors subsequently. (B) of FIG. 5 includes a cross section corresponding to a region of the transistor region 102 and a partial cross section corresponding to a region of the capacitor region 103. As shown in (B) of FIG. 4, in the silicon layers 112 divided by the first trenches 12, the active pillars 14 are formed in the middle of the silicon layers 112. The portion on the left side of each active pillar 14 connects with a bit line, and the portion on the right side of each active pillar 14 is a silicon pillar 13.

Further the multiple silicon pillars 13 in the embodiment of the present disclosure may be lateral silicon pillars for forming lateral capacitor structures. In order to make the capacitor structures more stable, a capacitor supporting structure may also be formed in the stack structure 11. Therefore, in some embodiments, the method may further include the following operations.

An oxide structure is formed in the multiple first trenches and above the stack structure.

A second patterning treatment is performed on the oxide structure, and multiple second trenches are formed in the oxide structure located above the capacitor region.

The sacrificial layers located below the second trenches are removed to form at least one supporting gap in the stack structure located above the capacitor region. The at least one supporting gap is arranged at intervals in the first direction, and the second trenches extend along the second direction.

At least one capacitor supporting structure is formed correspondingly in the at least one supporting gap. The silicon pillars penetrate through the at least one capacitor supporting structure.

It is to be noted that, during forming the capacitor supporting structure, multiple transistor supporting structures are formed simultaneously. Therefore, in some embodiments, when the multiple second trenches are formed in the oxide layer located above the capacitor region, the method may further include the following operations.

At least one pair of third trenches is formed in the oxide structure above the transistor region. Multiple active pillars are formed in the stack structure above the transistor region by retaining the silicon layers between the first trenches. The third trenches extend in the second direction.

The formation of the multiple transistors in the stack structure above the transistor region may include the following operations.

The sacrificial layers located directly below the at least one pair of third trenches are removed to form at least one pair of transistor gaps in the stack structure located above the transistor region.

A pair of spacer structures is formed on both sides of each of the transistor gaps, respectively.

The active pillars between the pairs of spacer structures are doped to form the sources and drains of the transistors.

A transistor supporting structure is formed between each pair of spacer structures.

The spacer structures, the sacrificial layers and the oxide structure between the transistor support structures are removed to expose the active pillars in the stack structure above the transistor region. The exposed active pillars form channels of the transistors.

Gates of the transistors are formed on surfaces of the channels of the transistors.

Figure 6:
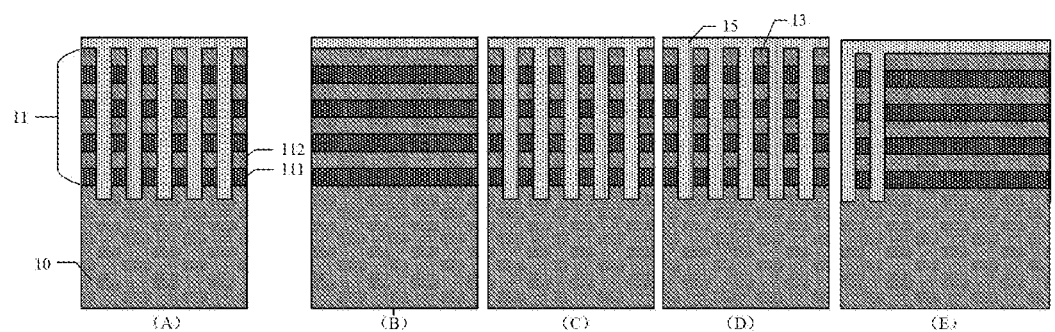

It is to be noted that, FIG. 6 is a scheme diagram of a structure obtained after forming an oxide structure 15. As shown in FIG. 6, the oxide structure 15 is formed in the first trenches and its height is higher than the height of the first trenches, that is, the oxide structure 15 is also formed on the stack structure 11. A material of the oxide structure 15 may be silicon oxide, and a method to form the oxide structure 15 may be deposition or oxidation growth. After silicon oxide is deposited, chemical mechanical polish (CMP) processing may be performed to make the top surface of the oxide structure 15 flat.

After forming the oxide structure 15, the oxide structure 15 is subjected to a second patterning processing to form multiple second trenches in the oxide structure 15, and simultaneously form at least one pair of third trenches in the oxide structure 15 while forming the multiple second trenches. That is, the second patterning processing of the oxide structure 15 may simultaneously form the multiple second trenches and the at least one pair of third trenches in the oxide structure 15.

The multiple second trenches are formed in the oxide structure 15 above the capacitor region 103, the at least one pair of third trenches are formed in the oxide structure 15 above the transistor region 102. The second trenches and the third trenches extend in the second direction.

Figure 7:
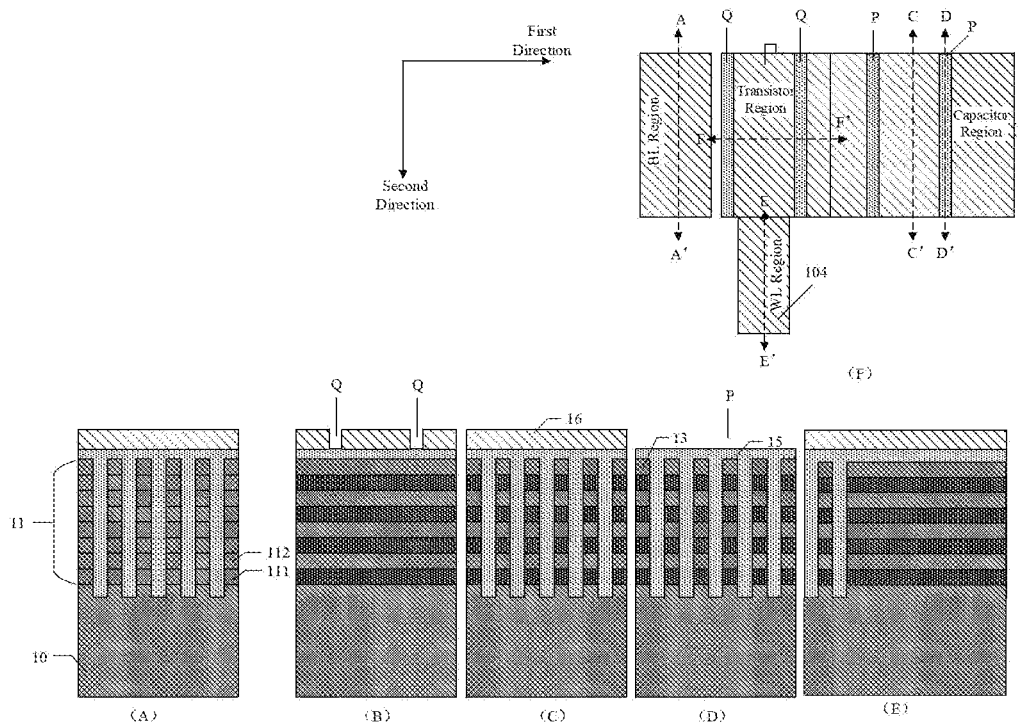

The multiple second trenches can be formed by the following operations. Firstly, a second photoresist layer 16 is formed on the oxide structure 15. FIG. 7 shows a scheme diagram of a structure obtained after forming the second photoresist layer 16. As shown in FIG. 7, the second photoresist layer 16 has a second pattern. Above the capacitor region 103, the second pattern includes a pattern for forming the second trenches, which correspond to the regions for forming supporting gaps. Above the transistor region 102, the second pattern includes a pattern for forming the third trenches, which correspond to the regions for forming transistor gaps. The second pattern extends in the second direction.

The second pattern is transferred to the oxide structure 15 and the second photoresist layer 16 is removed to form the multiple second trenches and the at least one pair of third trenches in the oxide structure 15. The number of the second trenches is the same as the number of the capacitor supporting structures to be formed. The number of the third trenches is related to the number of the transistor supporting structures to be formed. The embodiments of the disclosure take one transistor one capacitor (1T1C) memory cell as an example. The number of the transistors is the same as the number of the capacitors. The number of the capacitors is the number of the silicon pillars 13, and each capacitor is connected to a transistor. The parts of each active pillar 14 at the corresponding positions of the transistor supporting structures are used to form the source and drain of the transistors, so that a pair of the transistor supporting structures may be formed, respectively wrapping the sources of the transistors and the drains of the transistors at the corresponding positions of the active pillars.

As shown in FIG. 7, taking the formation of two capacitor supporting structures and the formation of a pair of transistor supporting structures as an example, the positions corresponding to the capacitor supporting structures above the capacitor region 103 are indicated by P, and the positions corresponding to the transistor supporting structures are indicated by Q.

Figure 8:
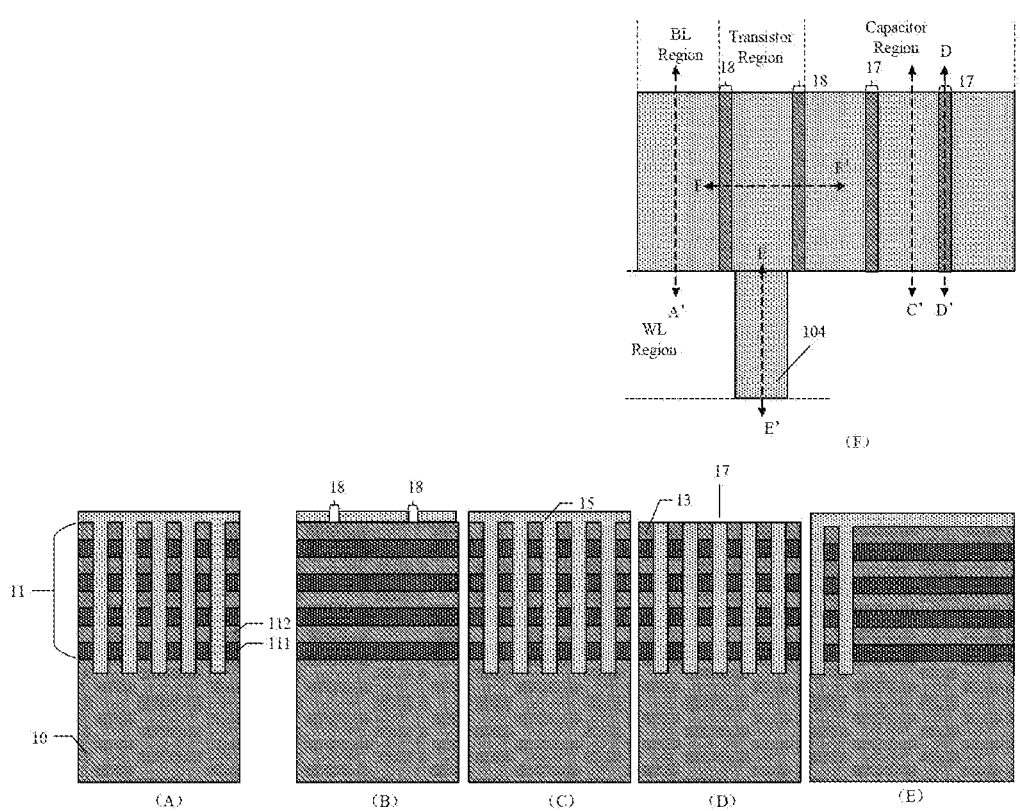

FIG. 8 shows a scheme diagram of a structure after forming the second trenches 17 and the third trenches 18 and removing the second photoresist layer 16. In the oxide structure 15, the second trenches 17 and the third trenches 18 are formed. The second trenches 17 and the third trenches 18 may be formed by etching part of the oxide structure 15.

It is to be noted that, when the second trenches 17 and the third trenches 18 are formed, the oxide structure 15 located below the second trenches 17 and the third trenches 18 may be further removed, thereby exposing the sacrificial layers 111, the silicon pillars 13 and the active pillars 14 located below the second trenches 17 and the third trenches 18. Next, the sacrificial layers 111 located below the second trenches 17 and the third trenches 18 are also removed, so that at least one 19 supporting gap is formed in the stack structure 11 above the capacitor region 103, while a pair of the transistor gaps 20 are formed in the stack structure 11 above the transistor region 102.

Figure 9:
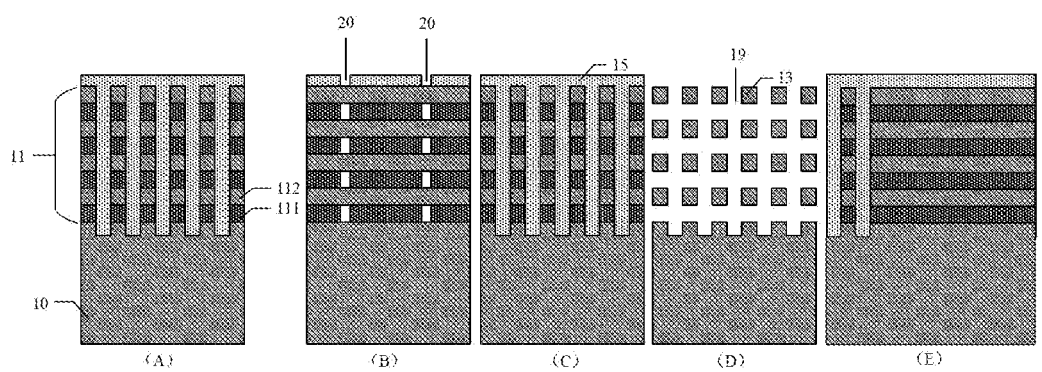

FIG. 9 shows a scheme diagram of a structure obtained after forming the supporting gaps 19 and the transistor gaps 20. As shown in FIG. 9, the part of the silicon pillars 13 below the second trenches 17 are completely exposed, and the gaps around the exposed silicon pillars 13 are the supporting gaps 19. The part of the active pillars 14 below the third trenches 18 are completely exposed, and the gaps around the partially exposed active pillars 14 are the transistor gaps 20.

The capacitor supporting structure is formed in the supporting gaps 19 while the transistor supporting structures are formed in the transistor gaps 20. The two of a pair of the transistor supporting structures are referred to as the first transistors supporting structure and the second transistor supporting structure, respectively. The material of the capacitor supporting structures and the transistor supporting structures may be silicon nitride (SiN), and the formation method may be deposition.

After forming the transistor supporting structures, a structure above the transistor region 102 is further processed to obtain the multiple transistors. The multiple transistors may be formed by firstly forming a pair of spacer structures on both sides of each of the transistor supporting structures. Specifically, firstly, a third photoresist layer 23 is formed above the oxide structure 15. The third photoresist layer 23 has a third pattern that extends in a second direction to expose the regions where the spacer structures need to be formed, and at the same time, the capacitor supporting structures and the transistor supporting structures may also be exposed.

Figure 10:
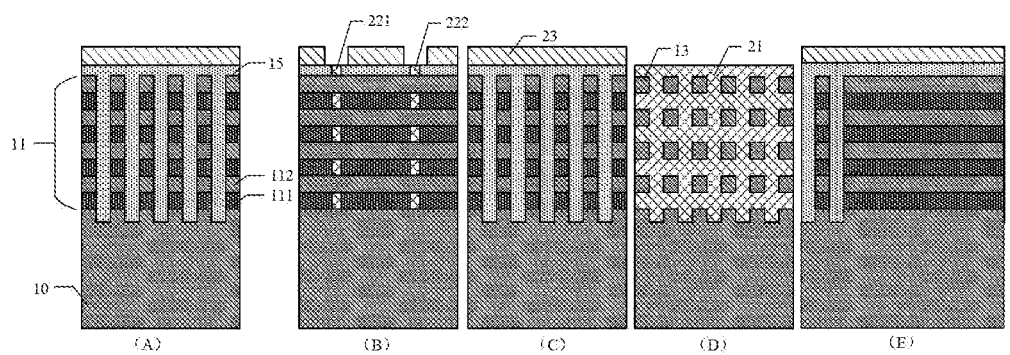

FIG. 10 shows scheme diagrams of a structure obtained after forming the third photoresist layer 23. It is to be noted that the operation is one of the operations for forming the transistors. As shown in FIG. 10, the third pattern of the third photoresist layer 23 is mainly formed above the transistor region 102. In addition, when the pattern is transferred by etching, an appropriate etching selection ratio may be selected, such that only the part of the oxide structure 15 below the exposed positions is etched and removed, and the capacitor supporting structures 21 and the transistor supporting structures (the first transistor supporting structures 221 and the second transistor supporting structures 222) are not etched and removed. Therefore, the third photoresist layer 23 may be unnecessary to cover the capacitor supporting structure 21 and the transistor supporting structures.

Figure 11:
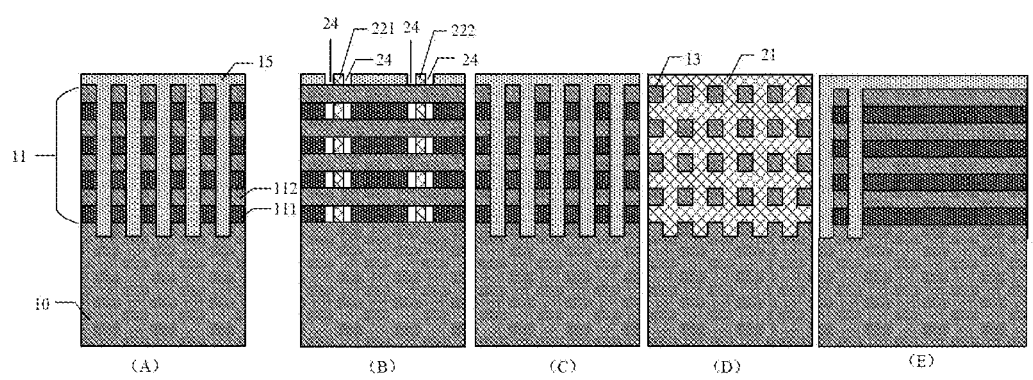

The oxide structure 15 exposed by the third pattern is removed and the sacrificial layers 111 below the third pattern are further removed to form two pairs of spacer gaps 24. FIG. 11 shows scheme diagrams of a structure obtained after forming the spacer gaps 24. As shown in FIG. 11, a pair of spacer gaps 24 is formed on both sides of the first transistor supporting structure 221, and another pair of spacer gaps 24 is formed on both sides of the second transistor supporting structure 222.

Figure 12:
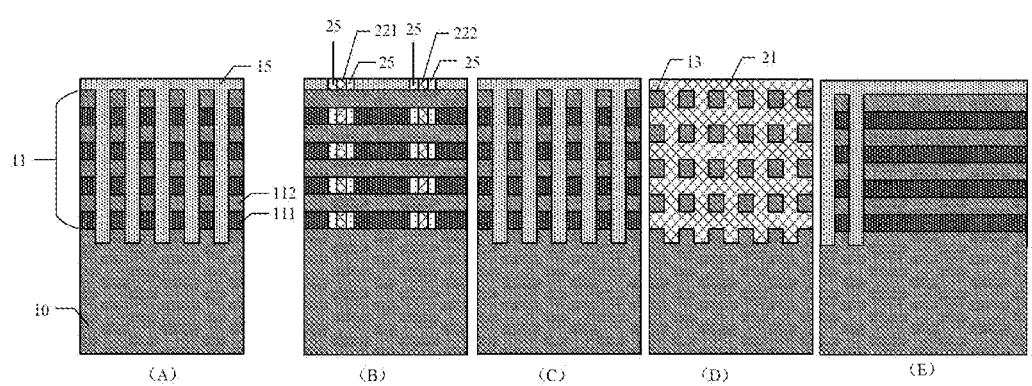

After the spacer gaps 24 are formed, two pairs of spacer structures 25 are formed in the two pairs of spacer gaps 24. The material of the spacer structures 25 may be spin on hardmask (SOH), and the method for forming the spacer structures 25 may be deposition. FIG. 12 is scheme diagrams of a structure obtained after forming the spacer structures 25. As shown in FIG. 12, the spacer gaps 24 are completely filled with the spacer structures 25.

Figure 13:
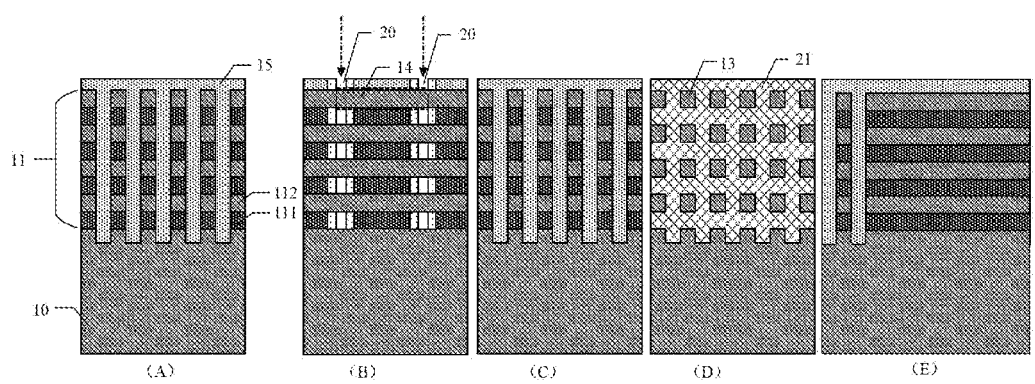

Next, the transistor supporting structures are removed, and the transistor gaps 20 are obtained again. FIG. 13 is scheme diagrams of a structure obtained after removing the transistor supporting structures. As shown in FIG. 13, the parts of each active pillar 14 exposed by the transistor gaps 20 are the portions that needs to be doped to form the source and drain of the transistor.

As indicated by arrows in FIG. 13, the active pillars 14 exposed by the transistor gaps 20 are doped to form the sources and the drains of the transistors, and the portions between the sources and the drains form the channels of the transistors. The portion of each channel connected to a silicon pillar 13 may be the source or the drain of the transistor. It can be seen from the above operations that the channels have been N-doped, while the sources and the drains may be P-doped, so that the type of each formed transistor is a PMOS transistor. In addition, the channels may be P-doped, and the sources and the drains are N-doped, so that the type of each transistor is an NMOS transistor. The specific type of the transistors is set according to the actual application, which is not specifically limited by the embodiments of this disclosure.

Figure 14:
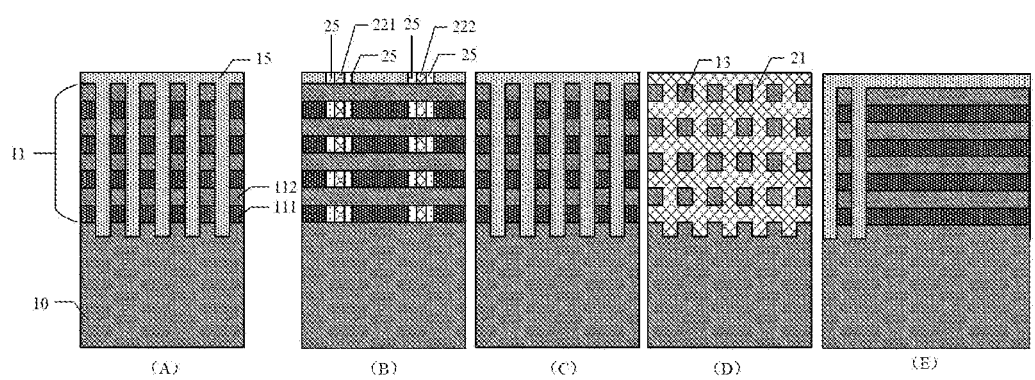

After the formation of the sources and the drains, the transistor supporting structures are formed again in the transistor gaps 20. The formation method may be deposition of silicon nitride. FIG. 14 is scheme diagrams of a structure obtained after forming the transistor supporting structures again. It can be seen that FIG. 14 is basically the same as FIG. 12, except that the sources and the drains of the transistors have been formed in FIG. 14.

It is to be noted that, the transistors may also be formed by the following operations. After forming the transistor gaps 20 as shown in FIG. 9, the active pillars 14 exposed by the transistor gaps 20 are doped to form the sources and the drains. Then the transistor supporting structures are formed in the transistor gaps 20, and then the spacer structures are formed in the foregoing method. By doing so, it is not necessary to form the transistor supporting structures first, then remove the same, and finally form the transistor supporting structures again. Thus, such operations simplify the process.

Figure 15:
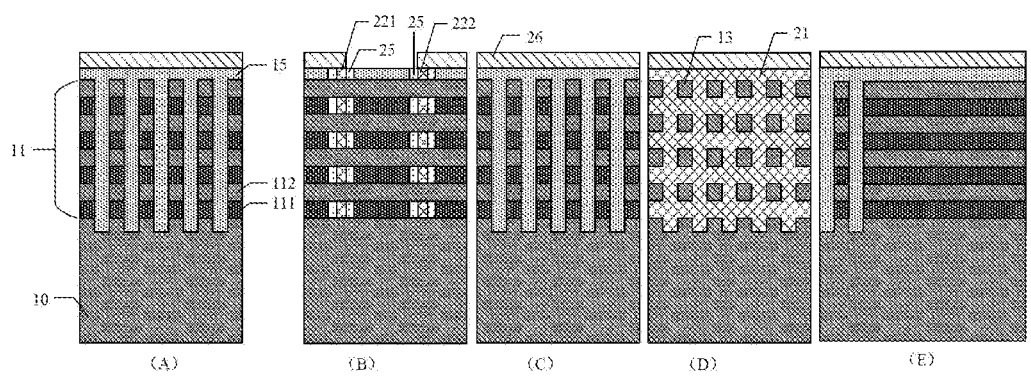
Figure 16:
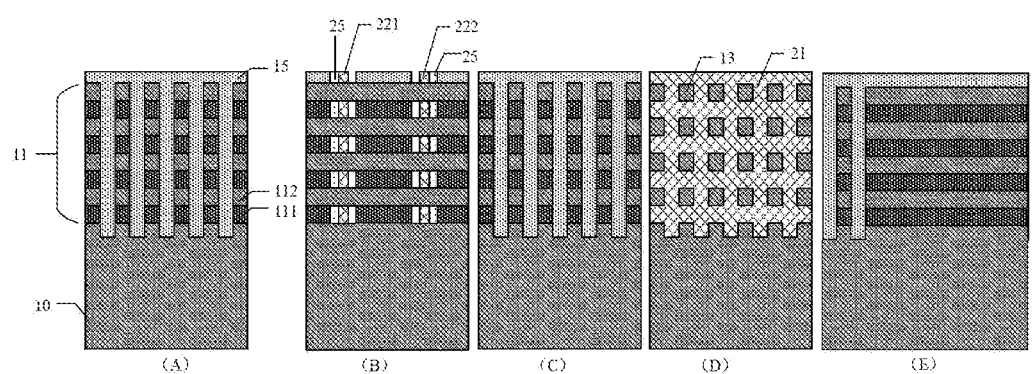

Next, the gates of the transistors are formed. In an embodiment of the disclosure, the gates may be GAA. The gates may be formed by the following operations. Firstly, a fourth photoresist layer is formed. FIG. 15 shows scheme diagrams of a structure obtained after forming the fourth photoresist layer 26. As shown in FIG. 15, the fourth photoresist layer 26 has a fourth pattern exposing the spacer structures 25 and the oxide layers 15 located between the first transistor supporting structures 221 and the second transistor supporting structure 222. The spacer structures 25 exposed by the fourth pattern are removed and the fourth photoresist layer 26 is removed. The resulting structure is shown in FIG. 16. A method to remove the spacer structures 25 may be selective etching, that is, only the spacer structures 25 are removed, but the oxide structure 15 is not removed.

Figure 17:
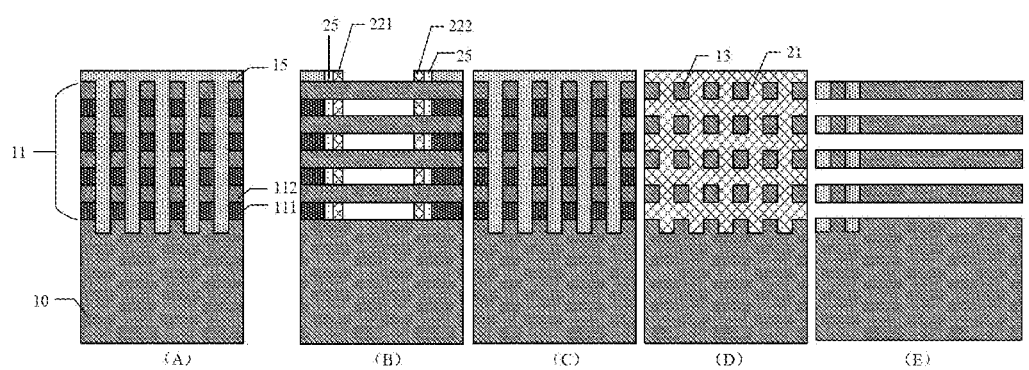

The sacrificial layers 111 above the transistor region 102 and the word line region 104 are removed, and the sacrificial layers 111 may be removed by selective etching. Further, the oxide structure 15 above the transistor region 102 is removed, the oxide structures between the silicon layers 112 above the word line region 104 is removed, so that the silicon layers 112 above the word line region 104 are exposed. The resulted structure is shown in FIG. 17, where the channels of the transistors are exposed.

Figure 18:
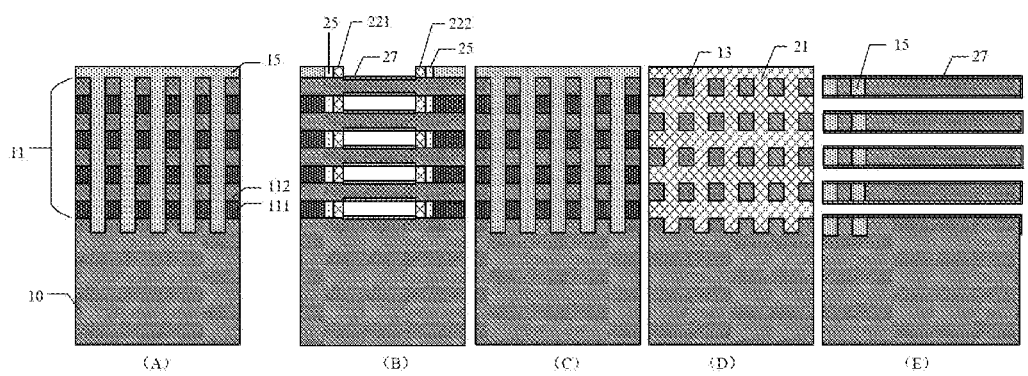

A first oxide layer 27 is formed on the surface of each of the exposed active pillars 14 (that is, the channels). The first oxide layers 27 are also formed on the remaining silicon layers 112 and the oxide structure 15 above the word line region 104. The resulting structure is shown in FIG. 18. The material of the first oxide layers 27 may be silicon oxide. The first oxide layers 27 may be formed by oxidation. The first oxide layers 27 may be used as gate dielectric layers of the transistors, respectively. In addition, the first oxide layers 27 and the oxide structure 15 may be made of a same material, so that they are shown with the same filling in the Figures, and for the convenience of distinction, lines are added at interfaces between them for distinction. In the embodiments of the disclosure, adjacent structures formed with the same material are distinguished by adding lines at interfaces.

Figure 19:
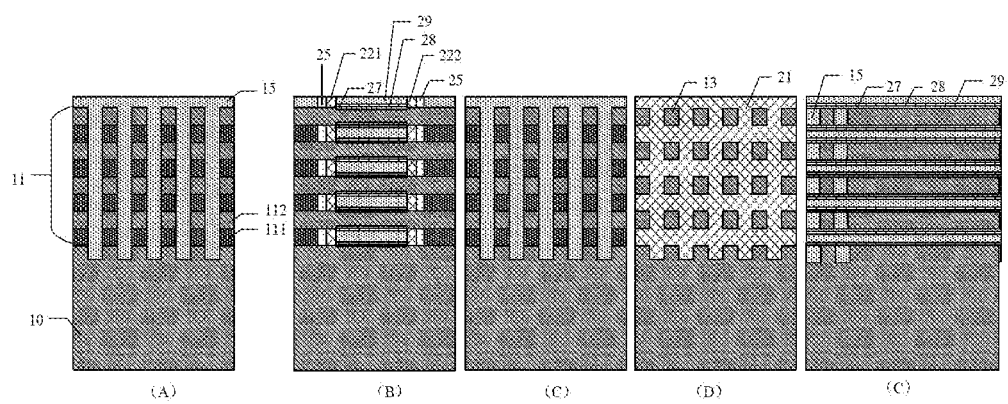

Next, a first metal layer 28 is formed on the surface of each of the first oxide layers 27, and the structure obtained after forming the first metals 28 is shown in FIG. 19. The first metal layers 28 formed above the transistor region 102 (that is, the first metal layers 28 formed on the surfaces of the channels of the transistors) form the gates of the transistors, and the first metal layers 28 for forming the gates wrap the channels of the active pillars 14 to form GAA. The first metal layers 28 formed above the word line region 104 form the word lines. As shown in FIG. 19, a second oxide layer 29 is formed above each of the uppermost metal layers.

A specific method for forming the first metal layers may include the following operations. Firstly, a metal deposition is performed on the structure shown in FIG. 18, and the deposited material is selectively deposited only on the surfaces of the oxide structure 15 and the first oxide layers 27, that is, the metal layer is deposited only on surfaces of silicon oxide, thereby forming initial first metal layers in the structure. The deposited material may be a conductive material such as titanium nitride. Then, an initial second oxide layer is formed in gaps between the initial first metal layers, on surfaces of the initial first metal layers and on an upper surface of the entire structure. At this time, the initial second oxide layer is provided on the upper surface of the entire structure, and the initial second oxide layer is filled between the spaces of the initial first metal layers. Next, both the initial first metal layer and the initial second oxide layer above the plane where the top surfaces of the capacitor supporting structures 21 are located are removed, for example, by etching or CMP, so as to obtain the structure as shown in FIG. 19.

Figure 20:
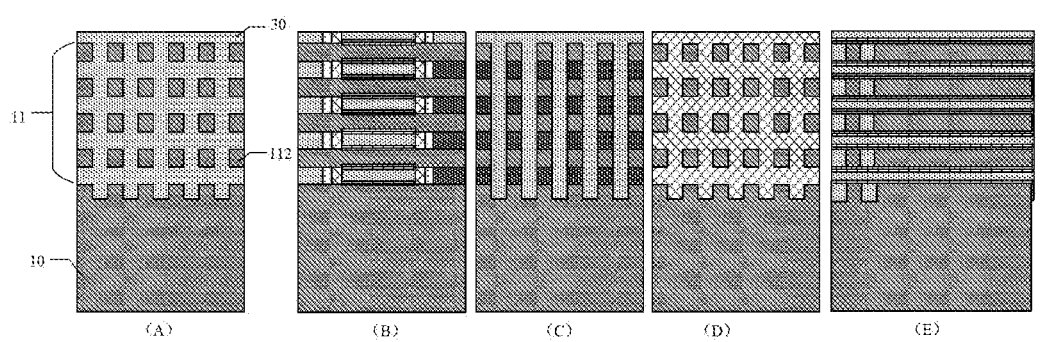

Next the bit lines are formed above the bit line region 101. The bit lines may be formed by the following operations. Firstly, all the oxide structure 15 above the bit line region 101 is removed, and then all the sacrificial layers 111 above the bit line region 101 are removed. It can be understood that the silicon layers 112 above the bit line region 101 are actually divided into multiple silicon pillar shapes when the silicon pillars 13 are formed as described above. The silicon pillars above the bit line region 10 are still referred to as the silicon layers in order to distinguish them from the silicon pillars for forming the capacitors. After both the oxide structure 15 and the sacrificial layers 111 are removed, all the silicon layers above the bit line region 10 are exposed and a third oxide layer 30 is formed in gaps between the exposed silicon layers. The resulting structure is shown in FIG. 20. The third oxide layer 30 is formed only above the bit line region 101. The structure shown in FIG. 20 is the same as that shown in FIG. 19 except for the part located above the bit line region 101.

Figure 21:
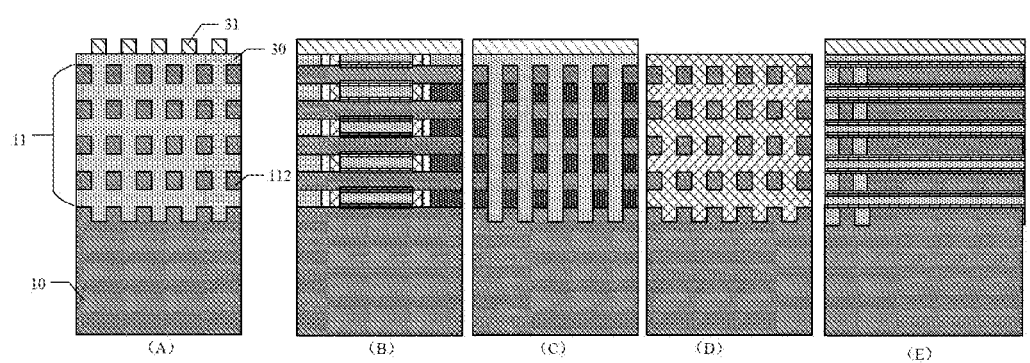

A fifth photoresist layer 31 is formed above the structure shown in FIG. 20, and FIG. 21 is scheme diagrams of the structure obtained after the fifth photoresist layer 31 is formed. As shown in FIG. 21, the fifth photoresist layer 31 has a fifth pattern extending in the second direction above the bit line region 101.

Figure 22:
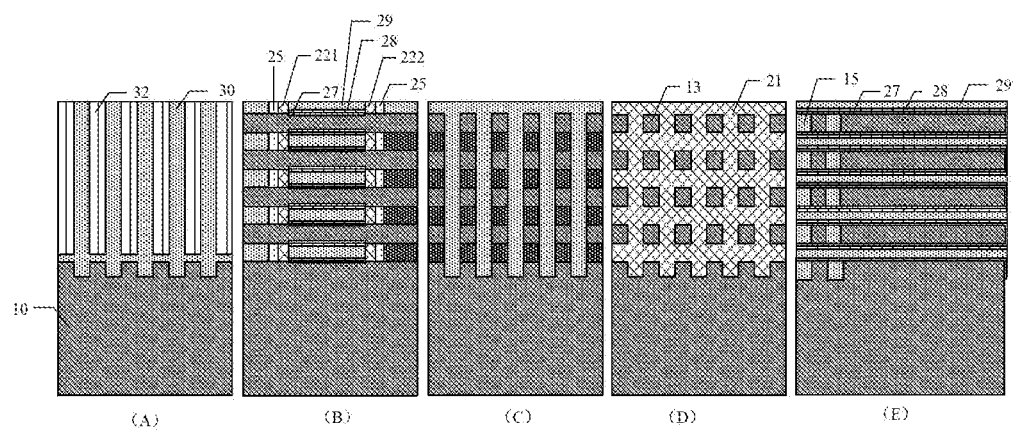

It is to be noted that, only the part above the bit line region 101 is patterned, and the other parts remain unchanged. Therefore the fifth pattern is mainly formed above the third oxide layer 30. Specifically, the separated silicon layers 112 above the bit line region 101 are directly below the fifth pattern. In addition, for the same reason as described above, when the pattern is transferred, only the material with a certain composition may be removed based on an etching selection ratio of different materials, so that the fifth photoresist layer 31 may not be formed above the capacitor supporting structures 21. Above the bit line region 101, the fifth pattern is transferred and the fifth photoresist layer 31 is removed, so that the third oxide layer 30 and the silicon layers 112 wrapped by the third oxide layer 30 directly below the fifth pattern are both removed. Multiple bit line trenches are formed, and second metal layers 32 are formed in the multiple bit line trenches. The second metal layers 32 form the multiple bit lines. The resulting structure after forming the bit lines is shown in FIG. 22. The second metal layers 32 may be formed by deposition, and the material of the second metal layers 32 may be a conductive material, such as tungsten (W), titanium nitride or the like.

It is to be noted that so far, a substrate including the multiple bit lines, the multiple transistors, the multiple silicon pillars and the multiple word lines is obtained. In addition, in embodiments of the disclosure, the formation of the multiple bit lines, the multiple transistors, the multiple silicon pillars and the multiple word lines may be implemented in any feasible manner in the art, which is not specially limited.

In an embodiment of the present disclosure, above the transistor region, a doped active pillar (including a channel portion, a source portion and a drain portion), a gate dielectric layer formed at the channel portion of the active pillar, and a GAA formed on the surface of the gate dielectric layer constitute a transistor. In some embodiments, the first portion of a silicon pillar is located at the junction of the silicon pillar and the corresponding adjacent transistor. In this way, a conductive part of the silicon pillar is connected with the corresponding transistor, thus ensuring normal electrical connection and normal operation of the capacitor and the transistor.

In S102, an insulating layer is formed at the second portion of each of the silicon pillars.

In S103, a conductive layer is formed at the first portion of each of the silicon pillars.

It is to be noted that, in an embodiment of the disclosure, for each of the silicon pillars, the first portion may denote a portion located at the junction of the silicon pillar and an adjacent transistor. The first portion is a conductive portion in the silicon pillar, and the second portion is an insulated portion in the silicon pillar.

As shown in FIG. 22, in the structure, the first portion of each silicon pillar is covered by a supporting structure 25 on one side of the second transistor spacer structure 222, and the second portion of each silicon pillar is covered by the sacrificial layers 111 and the oxide structure 15 (excluding the part of silicon pillars located in the capacitor supporting structures 21). At this time, the second portions of the silicon pillars need to be exposed so that they can be treated to form insulating layers.

As for the formation mode of the insulating layers, in some embodiments, the formation of an insulating layer at the second portion of the silicon pillar, includes the following operations.

An isolation oxide layer is formed above a plane where the top surface of the oxide structure is located.

The part of the isolation oxide layer located above the capacitor region except for the part located above the supporting structure is removed to expose the oxide structure at a corresponding position.

The oxide structure below the exposed positions is removed and the sacrificial layers above the capacitor region are removed, to expose the second portion of the silicon pillar.

An oxidization is performed on a surface of the second portion of the silicon pillar to form the insulating layer.

Figure 23:
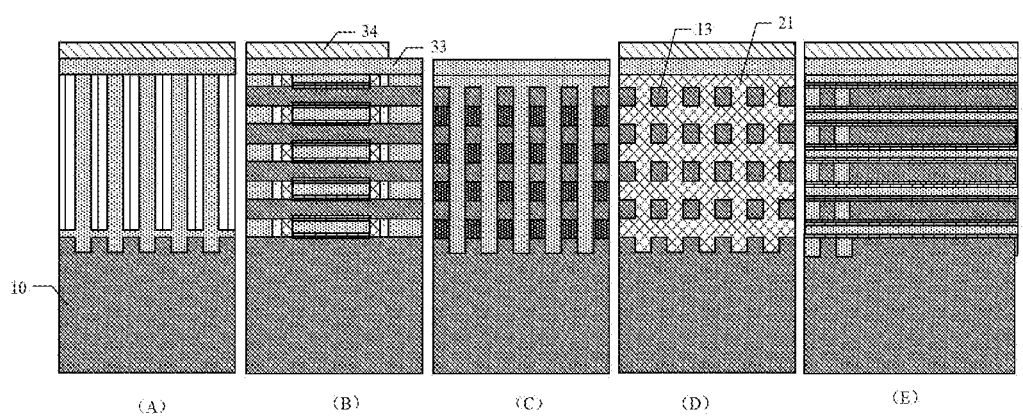

It is to be noted that, when the second portions of the silicon pillars are exposed, an isolation oxide layer 33 is first formed on the top of the structure shown in FIG. 22, and then a sixth photoresist layer 34 is formed on the isolation oxide layer 33. FIG. 23 is scheme diagrams of a structure obtained after forming the sixth photoresist layer 34. As shown in FIG. 23, the sixth photoresist layer 34 has a sixth pattern that exposes the isolation oxide layer 33 above the capacitor region 103 (excluding the isolation oxide layer 33 above the capacitor supporting structures 21). More specifically, the sixth pattern is located at a region above the multiple second portions of the silicon pillars 13. The top surfaces of the oxide structure 15 and the capacitor supporting structure 21 are in the same plane, and the isolation oxide layer 33 is formed on the plane of the top surface of the oxide structure 15. In addition, the material of the insolation oxide layer 33 may be the same as that of the foregoing oxide structure, oxide layer etc., such as silicon oxide, silicon dioxide or the like, and may be formed by deposition The sixth pattern is transferred to the isolation oxide layer 33 and the sixth photoresist layer 34 is removed. After the sixth pattern is transferred to the isolation oxide layer 33, the isolation oxide layer 33 below the sixth pattern is removed, and the oxide structure 15 at the corresponding position is exposed. The oxide structure 15 below the sixth pattern is completely removed, and the sacrificial layers 111 are completely removed, so that the second portions of the silicon pillars are exposed. The resulting structure is shown in FIG. 24.

Figure 24:
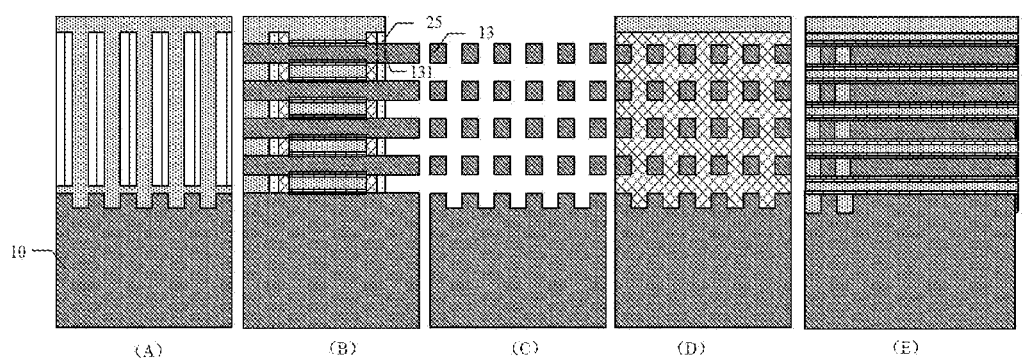
Figure 25:
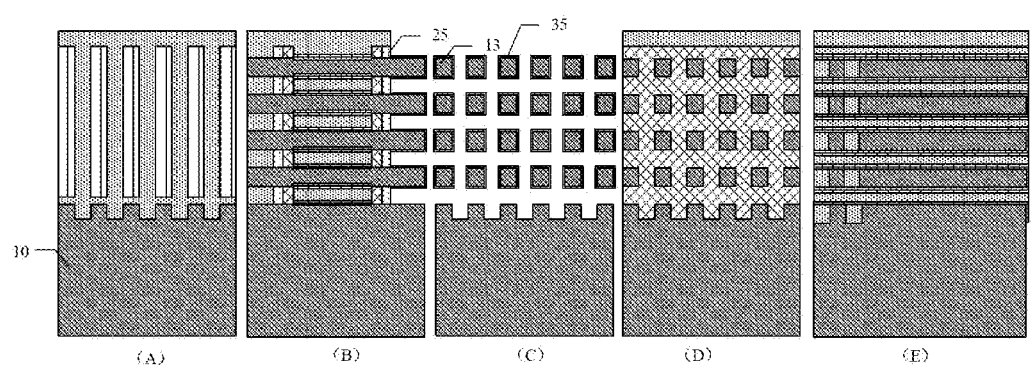

As shown in FIG. 24, the part of each silicon pillar 13 where the silicon pillar 13 is connected to the transistor (shown in a dashed box 131 in FIG. 24) is covered by the spacer structure 25, and the covered part is the first portion of the silicon pillar 13. The part not covered by the spacer structure 25 is the second portion of the silicon pillar 13, which is oxidized to form an insulating layer 35. The resulting structure is shown in FIG. 25.

It is to be noted that, in the embodiments of the disclosure, the insulating layers may be formed by oxidizing surfaces of the second portions of the silicon pillars. Therefore, silicon oxide is formed on the surfaces of the second portions in the silicon pillars as the insulating layers. Alternatively, the whole second portions of the silicon pillars are oxidized, so that second portions of the silicon pillars are completely oxidized into insulating silicon oxide. Yet alternatively, silicon oxide can be formed on the surfaces of second portions by deposition as the insulating layer. In addition, the structures such as oxide structure or oxide layer mentioned in the embodiments of the disclosure may be silicon oxide or silicon dioxide, which can be determined according to actual requirements and processes.

After the insulating layers are formed, the conductive layers are formed at the first portions of the silicon pillars. In some embodiments, the formation of a conductive layer on a surface of the first portion of each silicon pillar, includes the following operations.

The spacer structure is removed to expose the first portion of the silicon pillar.

A metal silicification treatment is performed on the first portion of the silicon pillar with a metal material to form the conductive layer.

Figure 26:
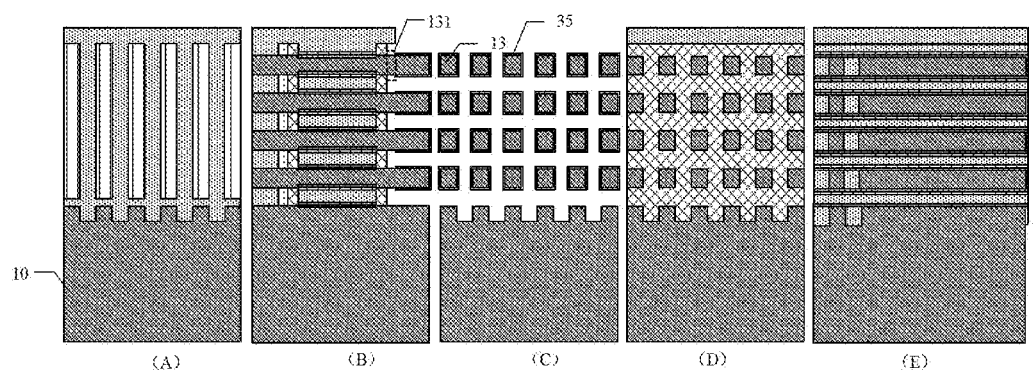

It is to be noted that, before forming the conductive layers, the spacer structure wrapped the first portions of the silicon pillars is first removed, thus exposing the first portions of the silicon pillars. After removing the spacer structure, the resulting structure is shown in FIG. 26. The dotted box shows the first portion 131 of the silicon pillar 13.

Figure 27:
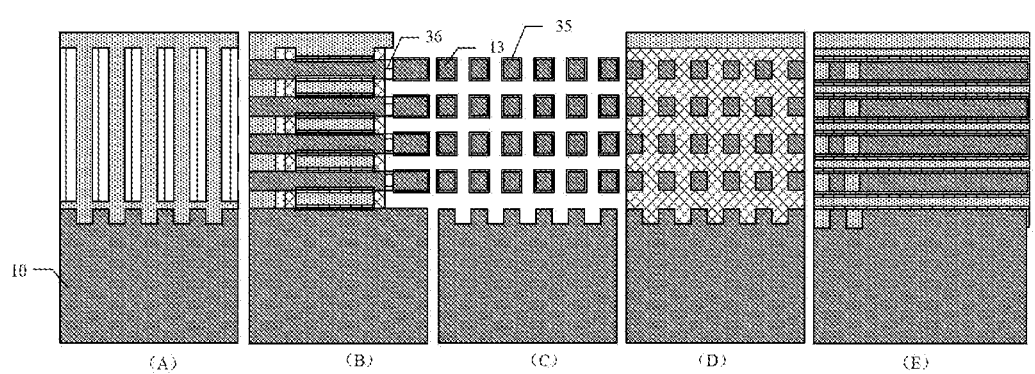

After the first portions of the silicon pillars are exposed, the first portions are processed, thereby forming the conductive layers at the first portions of the silicon pillars. FIG. 27 shows scheme diagrams of a structure obtained after forming the conductive layers 36. The conductive layers may be formed by reacting metal material with the silicon pillars to perform the metal silicification treatment. The material of the obtained conductive layers is a metal silicide.

The metal material includes at least one of titanium, cobalt or nickel.

It should be noted that when the first portions of the silicon pillars are treated with a metal material to obtain the conductive layers, the metal material such as titanium (Ti), cobalt (Co) or nickel (Ni) with low resistance and good conductivity may be selected. Therefore, by processing the first portion of the silicon pillars to a metal silicide through the reaction between the metal material with good conductivity and the silicon pillar, the conductive area is reduced without influence the normal performance of the semiconductor structure.

In S104, a capacitor layer is formed on surfaces of the insulating layer and the conductive layer of the silicon pillar.

It is to be noted that, in the embodiments of the present disclosure, a capacitor layer refers to electrode layers and a dielectric layer of a capacitor. Specifically, the formation of the capacitor layer on the surfaces of the insulating layer and the conductive layer of the silicon pillar includes the following operations.

A lower electrode layer is formed on the surfaces of the insulating layer and the conductive layer of the silicon pillar.

A dielectric layer is formed on a surface of the lower electrode layer.

An upper electrode layer is formed on a surface of the dielectric layer.

It is to be noted that, in the embodiments of the disclosure, each capacitor is composed of a silicon pillar, an insulating layer formed and a conductive layer on the surface of the silicon pillar, and a capacitor layer. The capacitor layer serves as a capacitor portion for storing data. The conductive layer formed at the first portion and connected with the transistor achieves the electrical connection between the capacitor and the transistor. The normal conductive function of the capacitor cannot be affected because of the good conductivity of the metal silicide. The insulating layer formed at the second portion is non-conductive, thereby reducing leakage of the capacitor.

Figure 28:
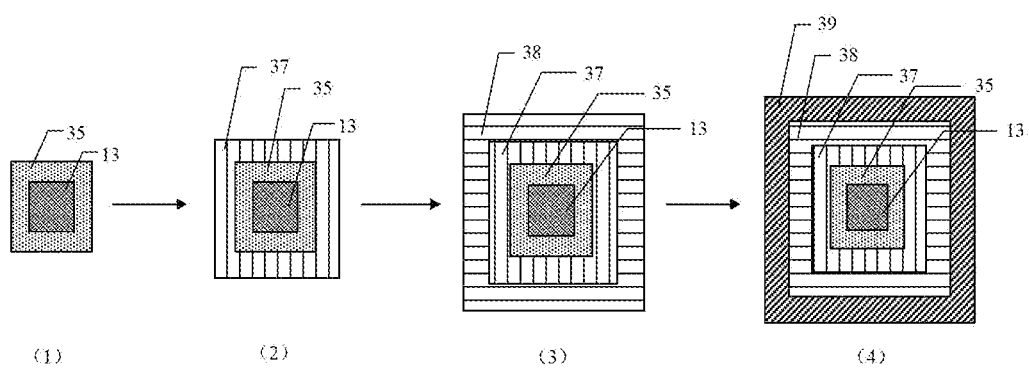

Each of the capacitor layers includes a lower electrode layer, a dielectric layer and an upper electrode layer. FIG. 28 is scheme diagrams showing the process for forming the capacitor layer, which shows a silicon pillar in the DD' direction.

As shown in FIG. 28, (1) shows the silicon pillar 13 and the insulating layer 35 already formed in FIG. 27. In the case that the cross section is of the first portion, the silicon pillar 13 is surrounded by the conductive layer 36. In FIG. 28, (2) shows a cross section of the silicon pillar after forming the lower electrode layer 37. The lower electrode layer 37 is formed on the surface of the insulating layer 35 and the conductive layer 36. The dielectric layer 38 is formed on the surface of the lower electrode layer 37 to obtain the cross section shown in (3) of FIG. 28. An upper electrode layer 39 is further formed on the surface of the dielectric layer 38 to obtain the cross section shown in (4) of FIG. 28. The lower electrode layer 37, the dielectric layer 38 and the upper electrode layer 39 may all be formed by deposition. The material of both of the upper electrode layer 39 and the lower electrode layer 37 may be a conductive material, such as titanium nitride. The material of the dielectric layer may be a material with high dielectric constant (High k), for example, hafnium oxide, zirconium oxide, lanthanum oxide, alumina, hafnium silicon oxide, hafnium oxynitride, or the like. In the silicon pillar, a length of the second portion may be larger than a length of the first portion, so that the conductive part of the silicon pillar in contact with the lower electrode layer of the capacitor is smaller and the leakage is reduced.

Figure 29:
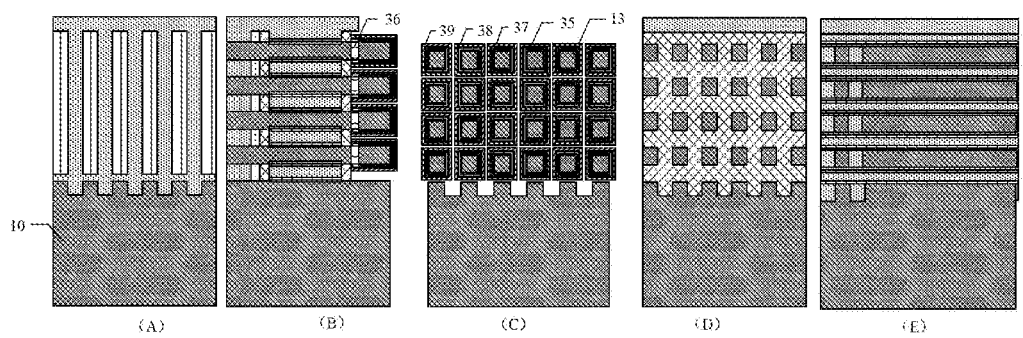

FIG. 29 shows scheme diagrams of a structure obtained after forming the capacitor layers. It can be seen that a conductive layer 36 is formed at the first portion of each silicon pillar 13, an insulating layer 35 is formed at the second portion 13 of each silicon pillar, a lower electrode layer 37 is formed on surfaces of the insulating layer 35 and the conductive layer 36 of each silicon pillar 13, a dielectric layer 38 is formed on a surface of the lower electrode layer, and an upper electrode layer 39 is formed on a surface of the dielectric layer. The silicon pillar 13, the conductive layer 36 formed at the first portion of the silicon pillar 13, the insulating layer 35 formed at the second portion of the silicon pillar 13, and the lower electrode layer 37 (also referred to as lower electrode plate), the dielectric layer 38, and the upper electrode layer 39 (also referred to as upper electrode plate) sequentially formed on the surfaces of the insulating layer 35 and the conductive layer 36 constitute a capacitor (also referred to as capacitor structure).

In the capacitor structure, between the silicon pillar and the lower electrode layer, electricity may only leak through a small area of the conductive layer located at first portion, and the rest portion are insulated, which effectively reduces the leakage of the capacitor.

After forming the capacitor layer on the surfaces of the insulating layer and the conductive layer of each silicon pillar, the method further includes the following operations.

An electrode filling structure is formed in gaps between the upper electrode layers, and the electrode filling structure completely fills the gaps of the upper electrode layers.

Figure 30:
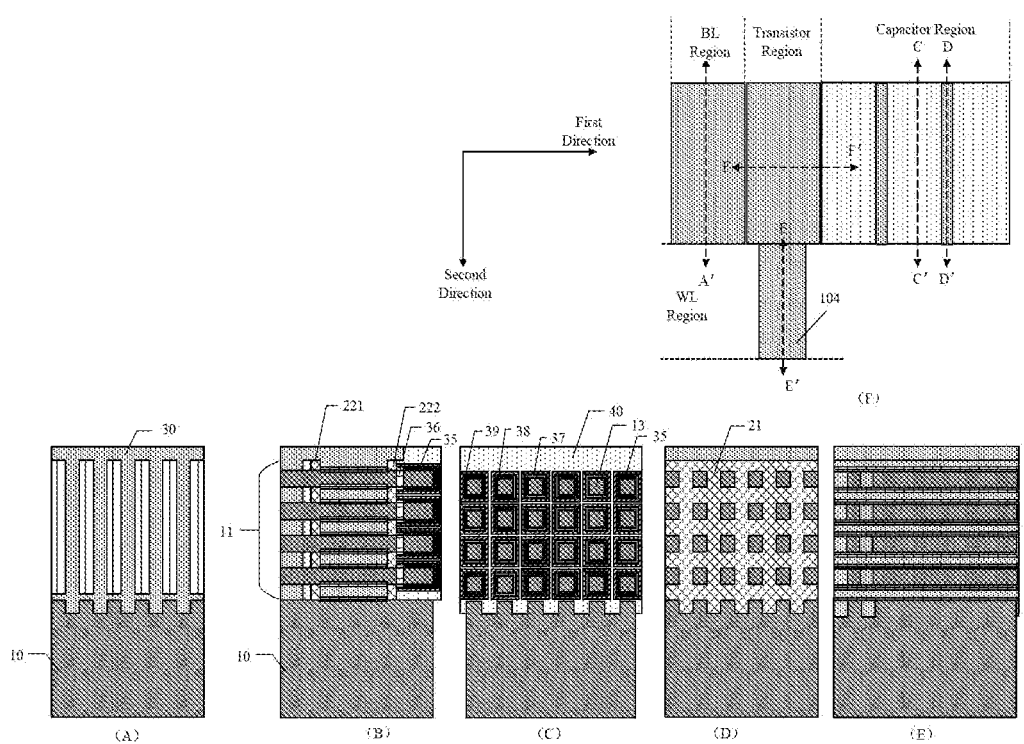
FIG. 30 is a structural scheme diagram of a semiconductor structure provided by an embodiment of the disclosure.

It is to be noted that, finally, an electrode filling structure 40 is formed in gaps between the upper electrode layers 39, and FIG. 30 shows a structure obtained after the electrode filling structure 40 is formed. As shown in FIG. 30, the electrode filling structure 40 completely fills the gaps between the upper electrode layers 39. The material of the electrode filling structure 40 may be polysilicon, and the electrode filling structure 40 may be formed by deposition.

The embodiments of the disclosure provide a method for manufacturing a semiconductor structure. The method includes the following operations. A substrate is provided. Multiple silicon pillars are formed in the substrate, and extend along a first direction. In the first direction, each of the silicon pillars includes a first portion and a second portion. An insulating layer is formed in the second portion of the silicon pillar. A conductive layer is formed in the first portion of the silicon pillar. A capacitor layer is formed on surfaces of the insulating layer and the conductive layer of the silicon pillar. As such, in each of the capacitor structures, the second portion of the silicon pillar is processed to form the insulating layer, and only the first portion provided with the conductive layer. Therefore, the conductive area between the capacitor layer and the silicon pillar is reduced, so that current can only partially flow through the silicon pillar via the conductive layer, thus reducing the leakage of the capacitor and improving the performance of the semiconductor structure. In addition, a material used to processing the silicon pillar to form the conductive layer is titanium, cobalt or nickel, or other materials with low resistance and good conductivity, so as to achieve good electrical conductivity when the conductive contact area between the silicon pillar and the lower electrode layers is reduced.

In another embodiment of the disclosure, another method for manufacturing a semiconductor structure is also provided. Taking 1T1C structure as an example, the process of a method for manufacturing a semiconductor structure in an embodiment of the present disclosure may be simplified as follows.

Figure 31:
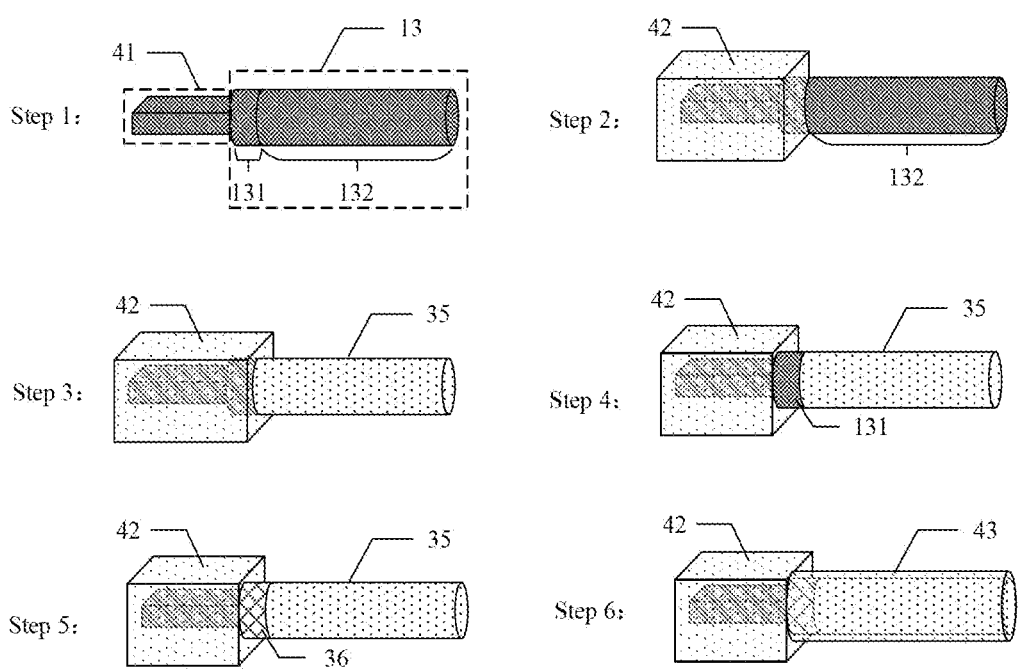
FIG. 31 is scheme diagrams of a manufacturing process of a semiconductor structure provided by an embodiment of the disclosure.

Referring to FIG. 31, scheme diagrams showing a process of manufacturing a semiconductor structure provided by an embodiment of the disclosure are shown. As shown in FIG. 31:

In operation 1, after a silicon pillar 13 is prepared, the silicon pillar 13 and a transistor 41 are connected together. The connection portion between the transistor 41 and the silicon pillar 13 may be a drain (drain terminal) of the transistor 41.

In operation 2, a part of the silicon pillar 13 near the transistor 41 is covered by a wrapping structure 42, and the covered part is the first portion 131 of the silicon pillar 13. The wrapping structure 42 may be entirely silicon oxide (or silicon dioxide). In the foregoing embodiment, the first portion of the silicon pillar 13 is covered by the spacer structure. The method for covering the first portion 131 of the silicon pillar 13 may be selected according to an actual process, and is not limited to the covering method provided by the embodiment of the disclosure, as long as the first portion 13 of the silicon pillar 131 of can be wrapped.

In operation 3, the exposed second portion 132 of the silicon pillar 13 is oxidized to form an insulating layer 35.

In operation 4, the wrapping structure 42 wrapping the first portion 131 of the silicon pillar 13 is removed, to expose the first portion 131 of the silicon pillar 13. In the foregoing embodiment, the spacer structure wrapping the first portion 131 of the silicon pillars 13 is removed.

In operation 5, a metal silicification treatment is performed on the first portion 121 of the silicon pillar 13 with a metal material, to form the conductive layer 36.

In operation 6, a capacitor layer 43 is formed on surfaces of the insulating layer and the conductive layer, and the capacitor layer 43 includes a lower electrode layer, a dielectric layer and an upper electrode layer as described above to obtain a capacitor structure.

Figure 32:
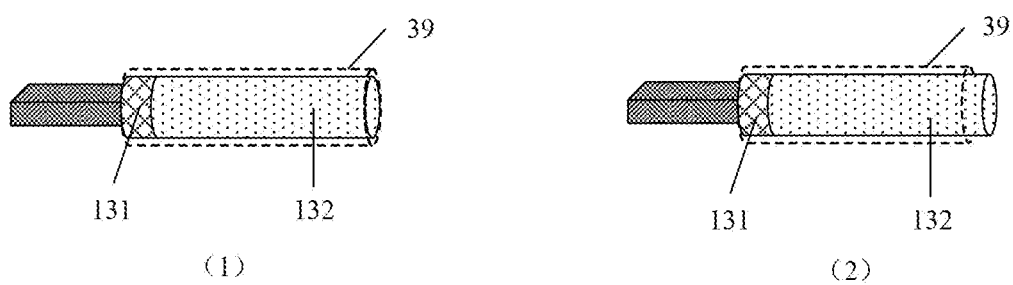
FIG. 32 is scheme diagrams of two different types of capacitor structures provided by embodiments of the disclosure.

In addition, in the embodiment of the disclosure, during forming the capacitor layer, the capacitor layer may completely wrap the head of the capacitor or may not wrap the head of the capacitor. FIG. 32 shows scheme diagrams of two different types of capacitor structures. As shown in FIG. 32, during forming the upper electrode layer 39, the upper electrode layer 39 may wrap the head of the capacitor as shown in (A) of FIG. 32, or may not wrap the head of the capacitor as shown in (B) of FIG. 32. This embodiment of the disclosure does not specifically limit this.

The embodiments of the disclosure provide a method for manufacturing a semiconductor structure. The specific implementation of the foregoing embodiments is described in detail through the above embodiments. It can be seen that in the lateral capacitors, the conductivity is increased and the resistance is reduced by performing oxidization treatment to a part of the silicon pillar and performing metal silicidation treatment on the bottom part of the silicon pillar close to the drain of the transistor. By doing so, charges can only flow through the metal silicidation conductive layer and be stored in the lower electrode layer of the capacitor (also called lower electrode plate of the capacitor), thus, the conductive contact area between the lower electrode plate and the silicon pillar is reduced, and the leakage is reduced.

In yet another embodiment of the present disclosure, a semiconductor structure is provided. The semiconductor structure may be manufactured according to the method for manufacturing a semiconductor structure described above. The semiconductor structure may be referred to FIG. 30. As shown in FIG. 30, the semiconductor structure may include a substrate, silicon pillars, insulating layers, conductive layers and capacitor layers.

The multiple silicon pillars 13 are formed in the substrate, and the multiple silicon pillars 13 all extend along a first direction. Each of the silicon pillars 13 includes a first portion and a second portion in the first direction.

The insulating layer is formed at the second portion of the silicon pillar.

The conductive layer is formed at the first portion of the silicon pillar.

The capacitor layer formed on surfaces of the insulating layer 35 and the conductive layers 36 of the silicon pillar 13.

It is to be noted that, the semiconductor structure can be prepared according to the manufacturing method described in the foregoing embodiments, and the reference numerals and structures not explicitly marked in FIG. 30 may also be understood with reference to the foregoing FIGS. 3 to 29 and related descriptions.

In some embodiments, as shown in FIG. 30, the substrate includes an initial substrate 10 and an initial stack structure 11 formed over the initial substrate 10. The multiple silicon pillars 13 are formed in the stack structure 11.

In some embodiments, as shown in FIG. 30 and referring to FIG. 4 the initial substrate 10 may include a bit line region 101, a transistor region 102, a capacitor region 103 and a word line region 104.

The multiple silicon pillars 13 are formed in the stack structure 11 above the capacitor region 103.

Multiple transistors are formed in the stack structure 11 above the transistor region 102.

Multiple word lines are formed in the stack structure 11 above the word line region 104.

Multiple bit lines are formed in the stack structure 11 above the bit line region 101.

In a first direction, the multiple bit lines, the multiple transistors and the multiple silicon pillars 13 are arranged sequentially. In a second direction, the multiple transistors and the multiple word lines are arranged sequentially.

In some embodiments, the first portion of each silicon pillar is located at a junction of the silicon pillar and the corresponding adjacent transistor.

In some embodiments, as shown in FIG. 30, at least one capacitor supporting structure 21 is further formed in the stack structure above the capacitor region 103, and the silicon pillars 13 penetrate the at least one capacitor supporting structure 21.

In some embodiments, at least one pair of transistor supporting structures are also formed in the stack structure above the transistor region, the at least one pair of transistor supporting structures wrap the sources and drains of the transistors, channels of the transistors are formed between the transistor supporting structures, and gates of the transistors are respectively formed on surfaces of the channels.

As shown in FIG. 30, taking a pair of transistors supporting structures as an example, the transistor supporting structures includes a first transistor supporting structure 221 and a second transistor supporting structure 222. A cross section of the transistor supporting structures in the second direction may refer to the capacitor supporting structure 21 shown in (D).

In some embodiments, a capacitor layer may include a lower electrode layer, a dielectric layer and an upper electrode layer.

The lower electrode layer is formed on the surfaces of the insulating layer and the conductive layer of the silicon pillar.

The dielectric layer is formed on a surface of the lower electrode layer.

The upper electrode layer is formed on a surface of the dielectric layer.

It should be noted that for a specific structure of the capacitor layer, reference may be made to (4) in FIG. 28.

In some embodiments, as shown in FIG. 30, the semiconductor structure may further include an electrode filling structure 40. The electrode filling structure 40 completely fills gaps between the upper electrode layers.

In some embodiments, the conductive layer is obtained by a metal silicification treatment on the first portion of the silicon pillar with a metal material. The metal material may include at least one of titanium, cobalt or nickel.

Details not disclosed in the embodiment can be understood with reference to the description of the foregoing embodiments, and are not repeated here.

Embodiments of the disclosure provide a semiconductor structure. The semiconductor structure includes: a substrate; multiple silicon pillars formed in the substrate and extending along a first direction, in which each of the silicon pillars includes a first portion and a second portion in the first direction; an insulating layer formed at the second portion of the silicon pillar; a conductive layer formed at the first portion of the silicon pillar; and a capacitor layer formed on surfaces of the insulating layer and the conductive layer of the silicon pillar. As such, each silicon pillar used to form a capacitor is divided into the first portion and the second portion, in which the second portion of the silicon pillar is treated to form the insulating layer, while the conductive layer is formed only at the first portion. Therefore, the conductive area between the capacitor layer and the silicon pillar is reduced, so that current can only flow through part of the silicon pillar via the conductive layer, and the rest of the silicon pillar is insulated, thereby reducing the leakage of the capacitor, and thus the semiconductor structure has a better storage performance.

Figure 33:
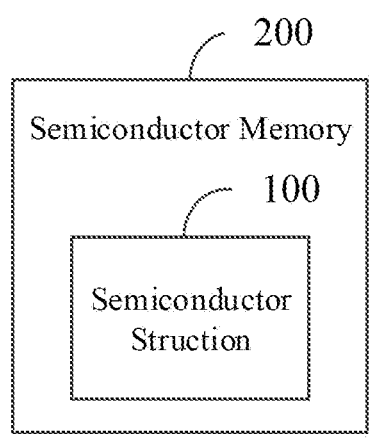
FIG. 33 is a structural scheme diagram a semiconductor memory provided by an embodiment of the disclosure.

In yet another embodiment of the disclosure, referring to FIG. 33, a scheme diagram of the structure of a semiconductor memory 200 provided by an embodiment of the present disclosure is shown. As shown in FIG. 33, the semiconductor memory 200 includes a semiconductor structure 100 described in any one of the foregoing embodiments.

In some embodiments, the semiconductor memory 200 may be a 3D DRAM.

Since the semiconductor memory 200 includes the semiconductor structure described in the foregoing embodiments, the leakage of the capacitor can be reduced and performance of the semiconductor memory 200 can be improved.

The above is only preferred embodiments of the present disclosure and is not intended to limit a scope of protection of the present disclosure.

It is to be noted that, in the present disclosure, the terms "include", "comprise" or any other variation thereof are intended to encompass non-exclusive inclusion, so that a process, method, article or device that includes a set of elements includes not only those elements, but also other elements that are not explicitly listed, or also elements inherent to such a process, method, article or device. In the absence of further limitations, an element defined by the phrase "include/comprise a . . . " does not exclude the existence of another identical element in the process, method, article or device in which it is included.

The above reference numerals of the embodiments in this disclosure are for description only, and do not represent the advantages and disadvantages of the embodiments.

The methods disclosed in several method embodiments provided in the disclosure can be arbitrarily combined as long as there is no conflict, to obtain a new method embodiment.

The features disclosed in several product embodiments provided in the disclosure can be arbitrarily combined as long as there is no conflict, to obtain a new product embodiment.

The features disclosed in the embodiments of several methods or devices provided by the disclosure can be arbitrarily combined as long as there is no conflict, in order to obtain a new embodiment of a method or embodiment of a device.

The above-mentioned are only the specific embodiments of the disclosure, and the scope of protection of the disclosure is not limited thereto. Within the technical scope of the disclosure, any skilled person familiar with the technical field may easily conceive of changes or substitutions, which should be covered within the scope of protection of the disclosure. Therefore, the scope of protection of the disclosure should be subject to the scope of protection of the claims.

The invention claimed is:

1. A method for manufacturing a semiconductor structure, comprising:
providing a substrate, wherein a plurality of silicon pillars are provided in the substrate, and the plurality of silicon pillars extend along a first direction, each of the plurality of silicon pillars comprises a first portion and a second portion along the first direction;
forming an insulating layer at the second portion of each of the plurality of silicon pillars;
forming a conductive layer at the first portion of each of the plurality of silicon pillars; and
forming a capacitor layer on surfaces of the insulating layer and the conductive layer of each of the plurality of silicon pillars.

2. The method according to claim 1, wherein providing the substrate comprises:
providing an initial substrate;
forming a stack structure on the initial substrate; and
forming the plurality of silicon pillars in the stack structure, wherein a spacer structure is formed between the first portions of the plurality of silicon pillars.

3. The method according to claim 2, wherein the initial substrate comprises a bit line region, a transistor region, a capacitor region, and a word line region;
wherein forming the plurality of silicon pillars in the stack structure comprises:
forming the plurality of silicon pillars in the stack structure above the capacitor region, and
wherein when forming the plurality of silicon pillars in the stack structure, the method further comprises:
forming a plurality of transistors in the stack structure above the transistor region;
forming a plurality of word line structures in the stack structure above the word line region; and
forming a plurality of bit line structures in the stack structure above the bit line region,
wherein in the first direction, a plurality of bit lines, the plurality of transistors and the plurality of silicon pillars are arranged sequentially, and in a second direction, the plurality of transistors and a plurality of word lines are arranged sequentially.

4. The method according to claim 3, wherein the first portion of each of the plurality of silicon pillars is located at a junction of each of the plurality of silicon pillars and the corresponding adjacent transistor.

5. The method according to claim 3, wherein the stack structure comprises at least one stack layer, the stack layer comprises a sacrificial layer and a silicon layer;
forming the stack structure on the initial substrate comprises:
forming a sacrificial layer above the initial substrate and forming a silicon layer above the sacrificial layer; and
repeating the forming of the sacrificial layer and the silicon layer until the stack structure is formed.

6. The method according to claim 5, wherein forming the plurality of silicon pillars in the stack structure above the capacitor region comprises:
performing a first patterning processing on the stack structure to form a plurality of first trenches in the stack structure; and
forming the plurality of silicon pillars in the stack structure above the capacitor region by retaining the silicon layer between the plurality of first trenches,
wherein the plurality of first trenches extend along the first direction.

7. The method according to claim 6, further comprising:
forming an oxide structure in the plurality of first trenches and on the stack structure;
performing a second patterning treatment on the oxide structure to form a plurality of second trenches in the oxide structure located above the capacitor region;
removing the sacrificial layer located below the plurality of second trenches to form at least one supporting gap in the stack structure located above the capacitor region, wherein the at least one supporting gap is arranged at intervals in the first direction, and the plurality of second trenches extend along the second direction; and forming at least one capacitor supporting structure in the at least one supporting gap, wherein the plurality of silicon pillars penetrate through the at least one capacitor supporting structure.

8. The method according to claim 7, wherein forming the insulating layer in the second portion of each of the plurality of silicon pillars comprises:

forming an isolation oxide layer on a plane where a top surface of the oxide structure is located;

removing the isolation oxide layer located above the capacitor region other than the part on the capacitor supporting structure to expose the oxide structure at the corresponding position;

removing the oxide structure below the exposed position and removing the sacrificial layer above the capacitor region to expose the second portions of each of the plurality of silicon pillars; and oxidizing a surface of the second portion of each of the plurality of silicon pillars to form the insulating layer.

9. The method according to claim 7, wherein when forming the plurality of second trenches in the oxide structure located above the capacitor region, the method further comprises:

forming at least one pair of third trenches in the oxide structure above the transistor region; and forming a plurality of active pillars in the stack structure above the transistor region by retaining the silicon layer between the plurality of first trenches, wherein the third trenches extend in the second direction, wherein forming the plurality of transistors in the stack structure above the transistor region comprises:

removing the sacrificial layers located below the at least one pair of third trenches to form at least one pair of transistor gaps in the stack structure located above the transistor region;

forming a pair of spacer structures on both sides of each of the transistor gaps, respectively;

doping the active pillars between the pairs of spacer structures to form the sources and drains of the transistors;

forming transistor supporting structures between the pairs of spacer structures;

removing the spacer structures, the sacrificial layers and the oxide structure between the transistor support structures to expose the active pillars in the stack structure over the transistor region, wherein the exposed active pillars form channels of the transistors, respectively; and forming a gate of each transistor on a surface of the channel of the transistor.

10. The method according to claim 1, wherein forming the capacitor layer on surfaces of the insulating layer and the conductive layer of each of the plurality of silicon pillars comprises:

forming a lower electrode layer on the surfaces of the insulating layer and the conductive layer of each of the plurality of silicon pillars;

forming a dielectric layer on a surface of the lower electrode layer; and forming an upper electrode layer on a surface of the dielectric layer.

11. The method according to claim 10, further comprising:

forming an electrode filling structure in gaps between the upper electrode layers, after forming the capacitor layer on the surfaces of the insulating layer and the conductive layer of each of the plurality of silicon pillars, wherein the electrode filling structure completely fills the gaps between the upper electrode layers.

12. A semiconductor structure, comprising:

a substrate, wherein a plurality of silicon pillars are formed in the substrate and extend along a first direction, each of the plurality of silicon pillars includes a first portion and a second portion in the first direction;

an insulating layer formed at the second portion of each of the plurality of silicon pillars;

a conductive layer formed at the first portion of each of the plurality of silicon pillars; and a capacitor layer formed on surfaces of the insulating layer and the conductive layer of each of the plurality of silicon pillars.

13. The semiconductor structure according to claim 12, wherein the substrate comprises an initial substrate and a stack structure formed on the initial substrate, wherein the plurality of silicon pillars are formed in the stack structure.

14. The semiconductor structure according to claim 13, wherein the initial substrate comprises a bit line region, a transistor region, a capacitor region, and a word line region, wherein the plurality of silicon pillars are formed in the stack structure above the capacitor region;

a plurality of transistors are formed in the stack structure above the transistor region;

a plurality of word lines are formed in the stack structure above the word line region; and a plurality of bit lines are formed in the stack structure above the bit line region;

wherein in a first direction, the plurality of bit lines, the plurality of transistors and the plurality of silicon pillars are arranged sequentially, and in a second direction, the plurality of transistors and the plurality of word lines are arranged sequentially.

15. The semiconductor structure according to claim 14, wherein the first portion of each of the plurality of silicon pillars is located at a junction of each of the plurality of silicon pillars and the corresponding adjacent transistor, or, wherein at least one capacitor supporting structure is further formed in the stack structure above the capacitor region, and each of the plurality of silicon pillars penetrate the at least one capacitor supporting structure; or at least one pair of transistor supporting structures are also formed in the stack structure above the transistor region, the at least one pair of transistor supporting structures wrap sources and drains of the transistors, channels of the transistors are formed between the transistor supporting structures, and gates of the transistors are respectively formed on surfaces of the channels.

16. The semiconductor structure according to claim 12, wherein the capacitor layer comprises:

a lower electrode layer, formed on the surfaces of the insulating layer and the conductive layer of each of the plurality of silicon pillars;

a dielectric layer, formed on a surface of the lower electrode layer; and an upper electrode layer, formed on a surface of the dielectric layer.

17. The semiconductor structure according to claim 16, further comprising an electrode filling structure, wherein the electrode filling structure completely fills gaps between the upper electrode layers.

18. A semiconductor memory comprising the semiconductor structure of claim 12.

* * * * *